United States Patent
Ha et al.

(10) Patent No.: US 12,349,502 B2
(45) Date of Patent: Jul. 1, 2025

(54) SOLAR CELL AND METHOD FOR MANUFACTURING THE SAME

(71) Applicant: Trina Solar Co., Ltd., Changzhou (CN)

(72) Inventors: Jungmin Ha, Seoul (KR); Sungjin Kim, Seoul (KR); Juhwa Cheong, Seoul (KR); Junyong Ahn, Seoul (KR); Hyungwook Choi, Seoul (KR); Wonjae Chang, Seoul (KR); Jaesung Kim, Seoul (KR)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/168,548

(22) Filed: Feb. 13, 2023

(65) Prior Publication Data
US 2023/0207712 A1    Jun. 29, 2023

Related U.S. Application Data

(63) Continuation of application No. 16/250,463, filed on Jan. 17, 2019, now Pat. No. 11,616,153, which is a
(Continued)

(30) Foreign Application Priority Data

Nov. 28, 2014  (KR) .................. 10-2014-0168624
Aug. 31, 2015  (KR) .................. 10-2015-0122846

(51) Int. Cl.
*H10F 77/20*    (2025.01)
*H10F 10/166*   (2025.01)
(Continued)

(52) U.S. Cl.
CPC ......... *H10F 77/215* (2025.01); *H10F 10/166* (2025.01); *H10F 10/174* (2025.01);
(Continued)

(58) Field of Classification Search
CPC ..... H01L 31/022425; H01L 31/022433; H01L 31/022441; H01L 31/0352; H01L 31/0201; H01L 31/02008; H10F 77/211
See application file for complete search history.

(56) References Cited

U.S. PATENT DOCUMENTS 5,178,685 A    1/1993  Borenstein et al.
9,224,888 B2 * 12/2015 Hashigami ............ H10F 77/311
(Continued)

FOREIGN PATENT DOCUMENTS

CN    201812825 U    4/2011
CN    103703567 B    4/2014
(Continued)

OTHER PUBLICATIONS

English machine translation of Yoshimine (WO 2013/094052), published Jun. 27, 2013.*

*Primary Examiner* — Christina Chern
(74) *Attorney, Agent, or Firm* — Taft Stettinius & Hollister LLP

(57) ABSTRACT

A solar cell can include a silicon semiconductor substrate; an oxide layer on a first surface of the silicon semiconductor substrate; a polysilicon layer on the oxide layer; a diffusion region at a second surface of the silicon semiconductor substrate; a dielectric film on the polysilicon layer; a first electrode connected to the polysilicon layer through the dielectric film; a passivation film on the diffusion region; and a second electrode connected to the diffusion region through the passivation film.

16 Claims, 18 Drawing Sheets

Related U.S. Application Data continuation of application No. 15/995,701, filed on Jun. 1, 2018, now Pat. No. 10,230,009, which is a continuation of application No. 15/643,180, filed on Jul. 6, 2017, now Pat. No. 10,014,419, which is a continuation of application No. 14/953,264, filed on Nov. 27, 2015, now Pat. No. 9,722,104.

(51) Int. Cl.
*H10F 10/174* (2025.01)
*H10F 71/00* (2025.01)
*H10F 77/00* (2025.01)
*H10F 77/164* (2025.01)
*H10F 77/30* (2025.01)

(52) U.S. Cl.
CPC ....... *H10F 71/1224* (2025.01); *H10F 71/128* (2025.01); *H10F 71/129* (2025.01); *H10F 77/1645* (2025.01); *H10F 77/211* (2025.01); *H10F 77/311* (2025.01); *H10F 77/315* (2025.01); *H10F 77/937* (2025.01); *Y02E 10/50* (2013.01)

(56) References Cited

U.S. PATENT DOCUMENTS

| | | |
|---|---|---|
| 2008/0216893 A1 | 9/2008 | Russell et al. |
| 2009/0165855 A1 | 7/2009 | Sun et al. |
| 2009/0205712 A1 | 8/2009 | Cousins |
| 2009/0314341 A1 | 12/2009 | Borden et al. |
| 2010/0116329 A1 | 5/2010 | Fitzgerald et al. |
| 2010/0294361 A1 | 11/2010 | Anderson et al. |
| 2011/0005582 A1 | 1/2011 | Szlufcik et al. |
| 2011/0100459 A1 | 5/2011 | Yoon et al. |
| 2011/0139243 A1 | 6/2011 | Shim et al. |
| 2011/0143486 A1 | 6/2011 | Hama et al. |
| 2011/0162706 A1 | 7/2011 | Borden et al. |
| 2011/0275175 A1 | 11/2011 | Minsek et al. |
| 2012/0298175 A1 | 11/2012 | Van Roosmalen et al. |
| 2012/0318340 A1 | 12/2012 | Heng et al. |
| 2013/0160836 A1* | 6/2013 | Kojo ............. H10F 77/211 438/98 |
| 2013/0233379 A1 | 9/2013 | Tanner et al. |
| 2014/0020747 A1 | 1/2014 | Kim et al. |
| 2014/0073105 A1 | 3/2014 | Isogai |
| 2014/0196768 A1 | 7/2014 | Heng et al. |
| 2014/0299187 A1 | 10/2014 | Chang et al. |
| 2014/0332072 A1 | 11/2014 | Beaucarne et al. |
| 2015/0086729 A1 | 3/2015 | Gortzen et al. |
| 2015/0129037 A1 | 5/2015 | Nam et al. |

FOREIGN PATENT DOCUMENTS

| | | |
|---|---|---|
| CN | 103779430 A | 5/2014 |
| CN | 104011874 A | 8/2014 |
| CN | 203760486 U | 8/2014 |
| CN | 203760493 U | 8/2014 |
| CN | 104078519 A | 10/2014 |
| EP | 2434548 A2 | 3/2012 |
| EP | 2787541 A1 | 10/2014 |
| EP | 2797124 A1 | 10/2014 |
| EP | 3018719 A2 | 5/2016 |
| JP | S56-60070 A | 5/1981 |
| JP | 2000340812 A | 12/2000 |
| JP | 2003298080 A | 10/2003 |
| JP | 2009295715 A | 12/2009 |
| JP | 2010186862 A | 6/2010 |
| JP | 2011512689 A | 4/2011 |
| JP | 2011181963 A | 9/2011 |
| JP | 2011187904 A | 9/2011 |
| JP | 2012004571 A | 1/2012 |
| JP | 2012-510714 A | 5/2012 |
| JP | 2013-77789 A | 4/2013 |
| JP | 2013-526053 A | 6/2013 |
| JP | 2014-53452 A | 3/2014 |
| JP | 2014-523653 A | 9/2014 |
| JP | 2014-203999 A | 10/2014 |
| JP | 2014-204128 A | 10/2014 |
| JP | 2016-103642 A | 6/2016 |
| KR | 1020110059366 A | 6/2011 |
| KR | 1020120106690 A | 9/2012 |
| KR | 1020120120260 A | 11/2012 |
| KR | 101442011 B1 | 9/2014 |
| KR | 1020140120992 A | 10/2014 |
| KR | 1020140120994 A | 10/2014 |
| KR | 1020150053551 A | 5/2015 |
| WO | 2009094578 A2 | 7/2009 |
| WO | 2010151478 A1 | 12/2010 |
| WO | 2013094052 A | 6/2013 |

* cited by examiner

SOLAR CELL AND METHOD FOR MANUFACTURING THE SAME

CROSS-REFERENCE TO RELATED APPLICATIONS

This application is a Continuation of U.S. patent application Ser. No. 16/250,463 filed on Jan. 17, 2019, which is a Continuation of U.S. patent application Ser. No. 15/995,701 filed on Jun. 1, 2018 (now U.S. Pat. No. 10,230,009 issued on Mar. 12, 2019), which is a Continuation of U.S. patent application Ser. No. 15/643,180 filed on Jul. 6, 2017 (now U.S. Pat. No. 10,014,419 issued on Jul. 3, 2018), which is a Continuation of U.S. patent application Ser. No. 14/953,264 filed on Nov. 27, 2015 (now U.S. Pat. No. 9,722,104 issued on Aug. 1, 2017), which claims priority to and the benefit of Korean Patent Application No. 10-2014-0168624 filed in the Korean Intellectual Property Office on Nov. 28, 2014, and Korean Patent Application No. 10-2015-0122846 filed in the Korean Intellectual Property Office on Aug. 31, 2015, the entire contents of all these applications are incorporated by reference into the present application.

BACKGROUND OF THE INVENTION

Field of the Invention

Embodiments of the present invention relate to a solar cell and a method for manufacturing the same.

Discussion of the Related Art

Recently, as the exhaustion of existing energy resources, such as petroleum and coal, is expected, there is a growing interest in alternative energy sources which will replace the existing energy resources. A solar cell as the alternative energy sources generates electric power from solar energy and has been in the spotlight because the solar cell uses energy resources that are abundant and the solar cell has no problem from an environmental pollution point of view.

A solar cell includes substrates made of semiconductors having different conductive types, such as a p type and an n type, a second conductive type semiconductor region (or emitter layer), and electrodes respectively connected to the substrates and the second conductive type semiconductor region. A p-n junction is formed at the interface of the substrate and the second conductive type semiconductor region.

When light is incident on such a solar cell, a plurality of electron-hole pairs are generated from the semiconductors. The generated electron-hole pairs are separated into electrons and holes. The separated electrons and holes move toward the n type semiconductor and the p type semiconductor, for example, toward the second conductive type semiconductor region and the substrate, respectively, and are collected by the electrodes electrically connected to the substrates and the second conductive type semiconductor region. The electrodes are connected by lines, thereby obtaining power.

SUMMARY OF THE INVENTION

A solar cell according to an example of the present invention includes a semiconductor substrate, a tunnel layer on the first surface of the semiconductor substrate, a first conductive type semiconductor region on the tunnel layer and configured to include impurities of a first conductive type, a second conductive type semiconductor region on a second surface which is the opposite surface of the semiconductor substrate and configured to include impurities of a second conductive type opposite the first conductive type, a first passivation film on the first conductive type semiconductor region, a first electrode formed on the first passivation film and connected to the first conductive type semiconductor region through an opening portion formed in the first passivation film, a second passivation film on the second conductive type semiconductor region, and a second electrode formed on the second passivation film and connected to the second conductive type semiconductor region through an opening portion formed in the second passivation film.

In this instance, the first electrode may include a plurality of first finger electrodes spaced apart from each other and extended in parallel in a first direction, and the second electrode may include a plurality of second finger electrodes spaced apart from each other and extended in parallel in the first direction.

Furthermore, the first electrode may further include a first bus bar configured to interconnect the plurality of first finger electrodes, and the second electrode may further include a second bus bar configured to interconnect the plurality of second finger electrodes.

In this instance, the first conductive type semiconductor region may be made of a polycrystalline silicon material, and the second conductive type semiconductor region may be made of a single crystal silicon material.

Furthermore, an isolation portion for preventing a contact between the first conductive type semiconductor region and the second conductive type semiconductor region may be formed on any one of the first surface, side, and second surface of the semiconductor substrate.

For example, the isolation portion may exclude the tunnel layer and the first conductive type semiconductor region, and may be in the edge portion of any one of the first surface, side, and second surface of the semiconductor substrate. The first passivation film may cover any one of the first surface, side, and second surface of the semiconductor substrate along with the isolation portion.

In this instance, the width of the isolation portion may be 1 nm to 1 mm. The thickness of the edge region in the first conductive type semiconductor region may be progressively decreased toward the isolation portion.

Furthermore, the first passivation film may include a side portion extending up the side of the semiconductor substrate.

Moreover, the second passivation film may include a side portion formed on the side surface of the semiconductor substrate. The side portion of the first passivation film on the side of the semiconductor substrate may be on the side portion of the second passivation film.

Furthermore, a first boundary surface in which the first conductive type semiconductor region and the first electrode come into contact with each other may be closer to the semiconductor substrate than a second boundary surface in which the first conductive type semiconductor region and the first passivation film come into contact with each other.

In this instance, a plurality of metal crystals extracted from the first electrode may be in an electrode forming region which belongs to the first conductive type semiconductor region and in which the first electrode may be formed. That is, the metal crystals may not be in a non-forming region which belongs to the first conductive type semiconductor region and in which the first electrode may not be formed. Furthermore, the metal crystals may not be in the tunnel layer.

The plurality of metal crystals may be in direct contact with the first electrode or may be spaced apart from the first electrode.

In this instance, all of the plurality of first finger electrodes and the first bus bar may be connected to the first conductive type semiconductor region through the first passivation film.

In this instance, all of the plurality of first finger electrodes and the first bus bar may have a single layer or double layer structure. In some embodiments, the plurality of first finger electrodes may have a single layer structure, and the first bus bar may have a double layer structure.

In this instance, the plurality of metal crystals may be in a region which belongs to the first conductive type semiconductor region and in which the plurality of first finger electrodes is formed and a region which belongs to the first conductive type semiconductor region and in which the first bus bar is formed.

In some embodiments, the plurality of first finger electrodes may be connected to the first conductive type semiconductor region through the first passivation film. The first bus bar may be configured to not penetrate the first passivation film and may be formed on the back surface of the first passivation film.

In this instance, the plurality of metal crystals may be in a region which belongs to the first conductive type semiconductor region and in which the first finger electrodes are formed. The plurality of metal crystals may not be in a region which belongs to the first conductive type semiconductor region and in which the first bus bar is formed.

In this instance, the plurality of first finger electrodes and the first bus bar may have different compositions. For example, a content of a frit glass per unit volume which is included in the plurality of first finger electrodes may be greater than a content of a frit glass per unit volume which is included in the first bus bar.

Furthermore, a content of a frit glass per unit volume which is included in the plurality of first finger electrodes may be identical with a content of a frit glass per unit volume which is included in the first bus bar.

Furthermore, content of a metal material per unit volume which is included in the plurality of first finger electrodes may be greater than content of a metal material per unit volume which is included in the first bus bar.

Furthermore, a method for manufacturing a solar cell according to an example of the present invention includes a tunnel layer forming operation of forming a tunnel layer on the first surface of a semiconductor substrate, an intrinsic semiconductor layer forming operation of forming an intrinsic semiconductor layer on the tunnel layer formed on the first surface of the semiconductor substrate, a first conductive type semiconductor region forming operation of forming a first conductive type semiconductor region by doping impurities of a first conductive type into the intrinsic semiconductor layer formed on the first surface of the semiconductor substrate, a second conductive type semiconductor region forming operation of forming a second conductive type semiconductor region by doping impurities of a second conductive type into the second surface of the semiconductor substrate, a first passivation film forming operation of forming a first passivation film on the first conductive type semiconductor region, and an electrode forming operation of forming a first electrode connected to the first conductive type semiconductor region and a second electrode connected to the second conductive type semiconductor region.

In this instance, the method may further include the operation of forming an opening portion in the first passivation film after the first passivation film forming operation.

The operation of forming the opening portion in the first passivation film may be performed by thermal treatment in the electrode forming operation.

The electrode forming operation may include a first electrode forming operation of forming the first electrode. The first electrode forming operation may include printing a paste for first finger electrodes for forming the first finger electrodes and a paste for a first bus bar for forming the first bus bar on the first passivation film and performing thermal treatment on the pastes. During such a thermal treatment process, the paste for the first finger electrodes and the paste for the first bus bar may perforate the first passivation film and may be connected to the first conductive type semiconductor region. In this instance, the opening portion may be formed in the first passivation film.

In the first electrode forming operation, the highest temperature for the thermal treatment may be between 795° C. to 870° C.

In the first electrode forming operation, the paste for the first finger electrodes and the paste for the first bus bar may be printed through a single process. In this instance, a material included in the paste for the first finger electrodes may be identical with a material included in the paste for the first bus bar.

Furthermore, in some embodiments, in the first electrode forming operation, the paste for the first finger electrodes and the paste for the first bus bar may be printed using separate printing processes. In this instance, a material included in the paste for the first finger electrodes and a material included in the paste for the first bus bar may be different.

Furthermore, the tunnel layer forming operation may include forming the tunnel layer on the first and second surfaces of the semiconductor substrate. The intrinsic semiconductor layer forming operation may include forming the intrinsic semiconductor layer on the tunnel layers formed on the first and second surfaces of the semiconductor substrate. The method may further include a removing operation of removing the tunnel layer and the intrinsic semiconductor layer or the first conductive type semiconductor region placed at least on the second surface of the semiconductor substrate prior to the second conductive type semiconductor region forming operation after the first conductive type semiconductor region forming operation.

The removing operation may include forming an isolation portion by removing the tunnel layer placed on one side of the semiconductor substrate and an edge portion of the first conductive type semiconductor region. The first passivation film may cover the first surface of the semiconductor substrate along with the isolation portion.

More specifically, the removing operation may include forming a mask layer having a smaller area than the semiconductor substrate on the first conductive type semiconductor region on the other side of the semiconductor substrate, etching the first conductive type semiconductor region and the tunnel layer placed in a portion in which the mask layer has not been formed, and removing the mask layer.

Furthermore, the method may further include forming a second passivation film covering the second conductive type semiconductor region between the operation of forming the second conductive type semiconductor region and the operation of forming the first passivation film. The second passivation film may be placed on the side of the semiconductor substrate, and the first passivation film may be placed on the second passivation film.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE EMBODIMENTS

Figure 1:
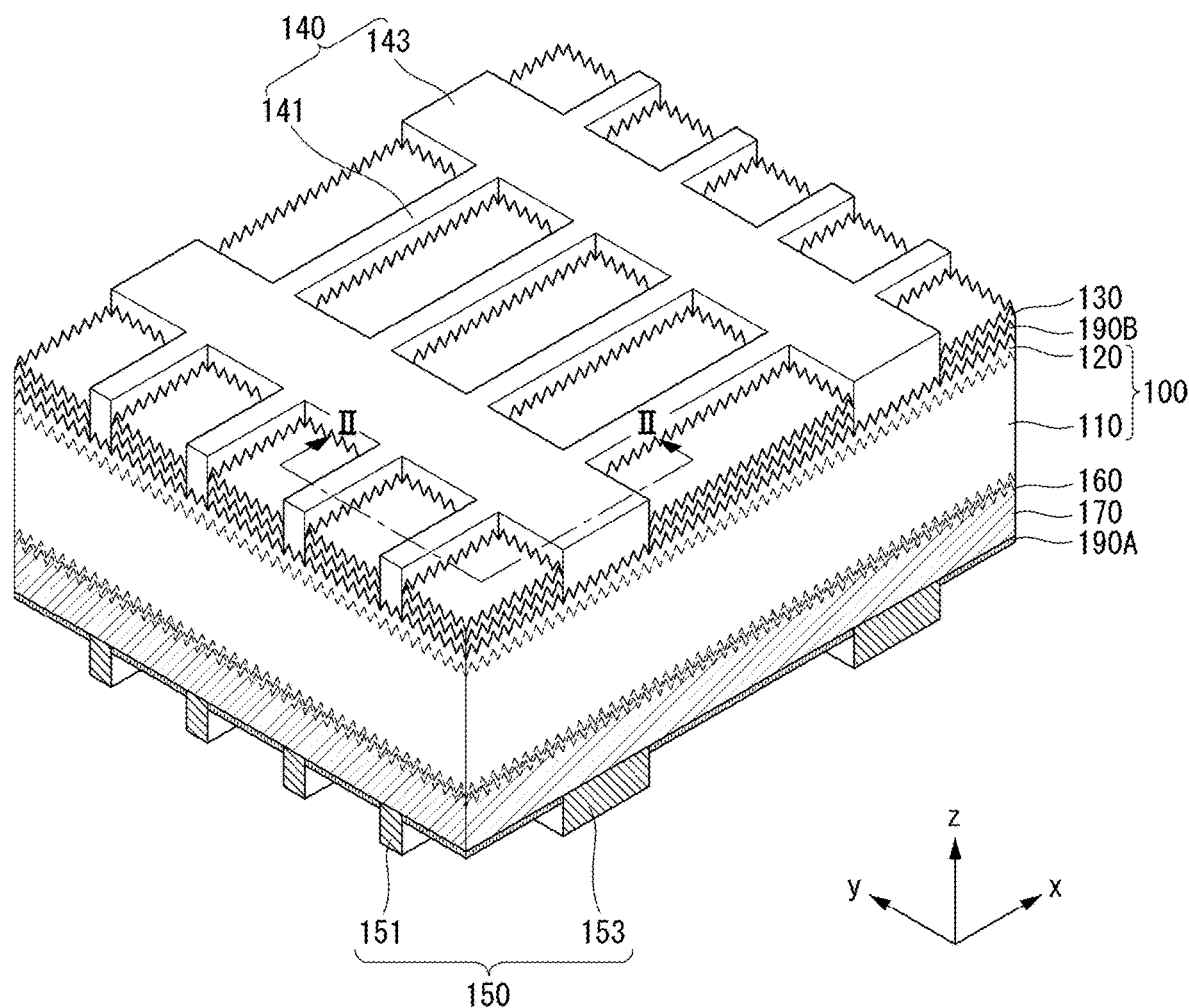
FIGS. 1 to 3 are diagrams illustrating a solar cell according to a first embodiment of the present invention.

Embodiments of the present invention are described more fully hereinafter with reference to the accompanying drawings. As those skilled in the art would realize, the described embodiments may be modified in various different ways, all without departing from the spirit or scope of the present invention. In order to clarify a description of the present invention, a description of parts not related to the description is omitted, and the same reference numbers are used throughout the specification to refer to the same or like parts.

In the drawings, the thickness of layers and an area has been enlarged for better understanding and ease of description. When it is described that a part, such as a layer, film, area, or substrate, is "over" or "on" another part, the part may be "directly" on another part or a third part may be present between the two parts. In contrast, when it is described that a part is "directly on" another part, it means that a third part is not present between the two parts. Furthermore, when it is described that a part is "generally" formed on another part, it means the part is not formed on the entire surface (or front surface) of another part and is also not formed in part of the edge of the entire surface.

Furthermore, expressions, such as "the first" and "the second", are used to distinguish one part from the other part, and the present invention is not limited thereto.

Furthermore, a "front surface" may be one surface of a semiconductor substrate on which direct light is incident, and a "back surface" may be the opposite surface of the semiconductor substrate on which direct light is not incident or on which reflected light other than direct light may be incident.

Furthermore, if two values are the same, it means that the two values are the same within an error range of 10% or less.

Solar cells and methods for manufacturing the same according to embodiments of the present invention are described in detail below.

Figure 2:
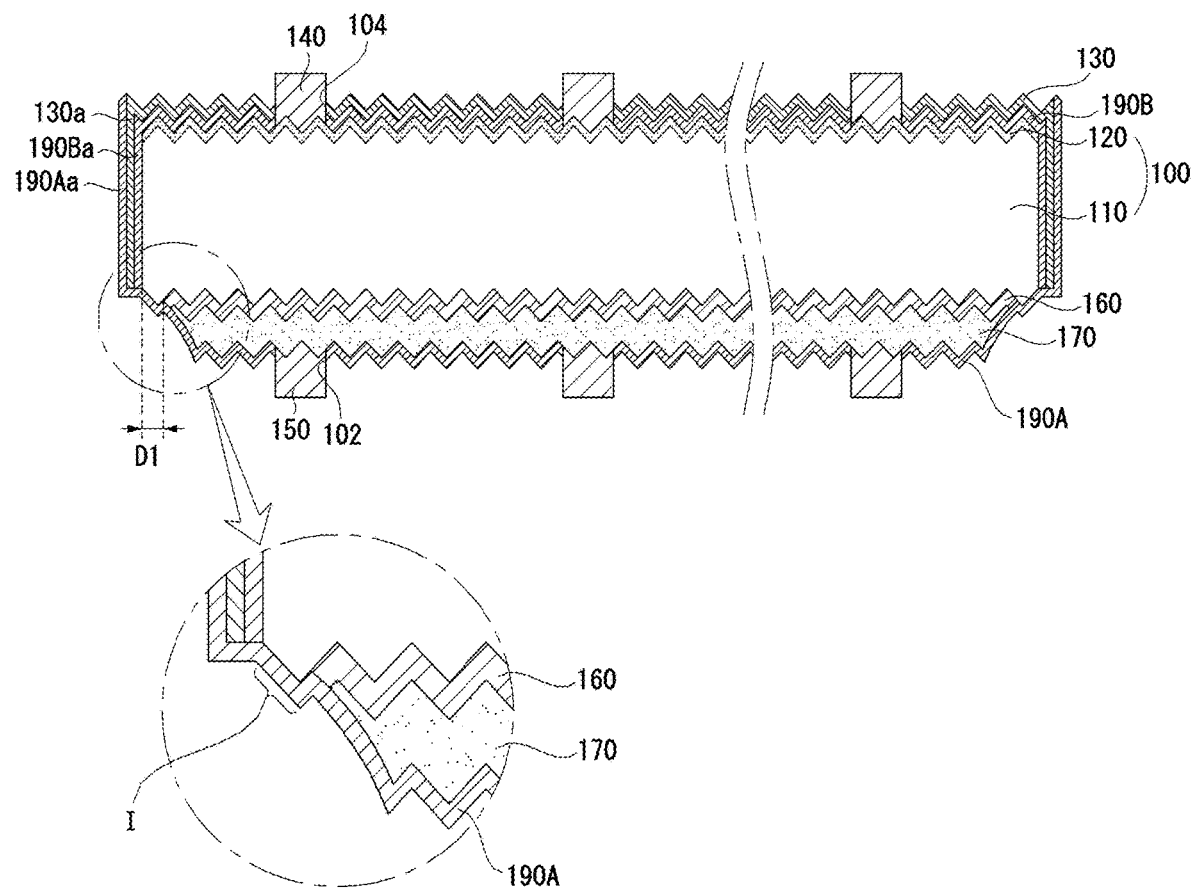
Figure 3:
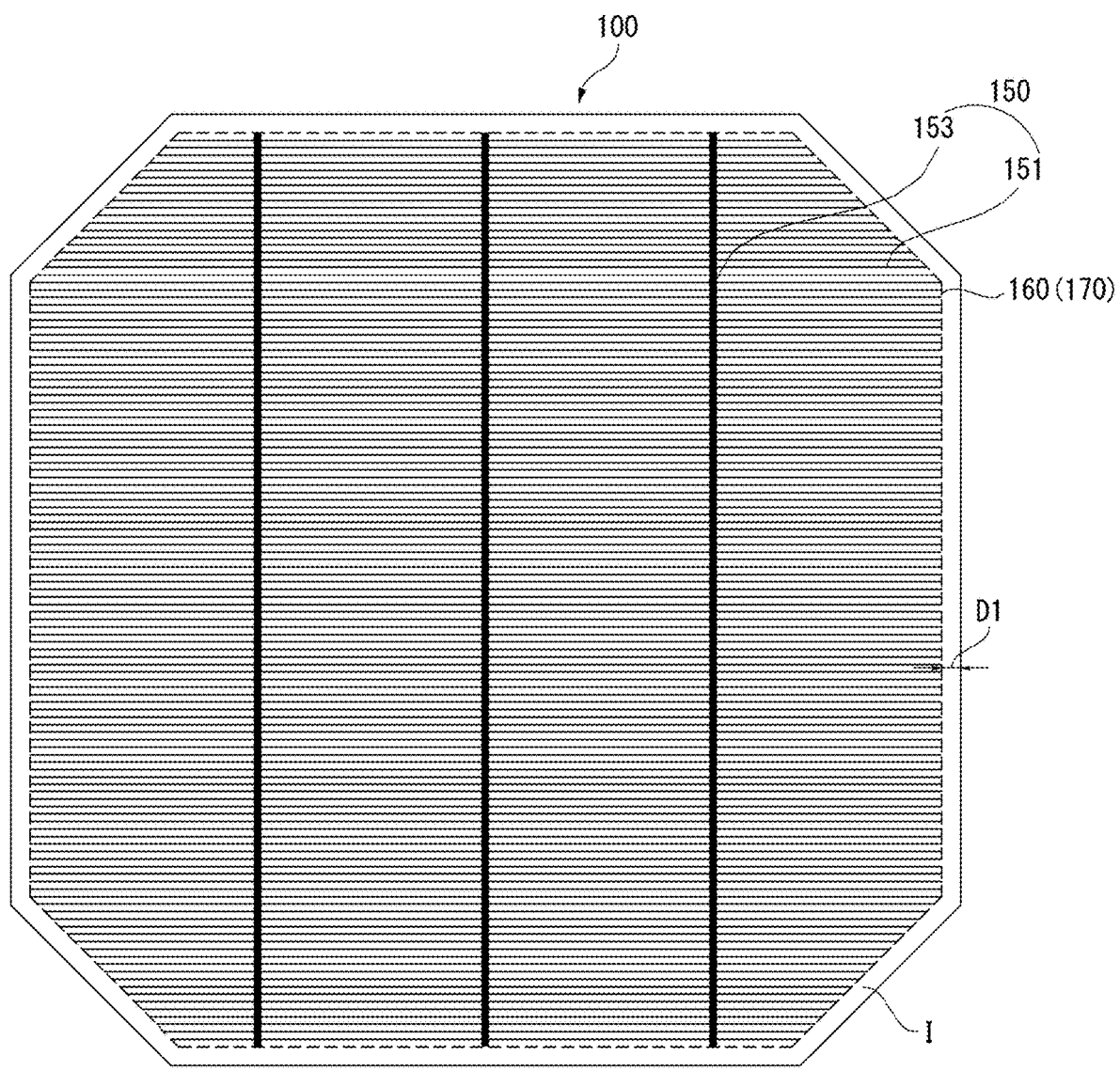

FIGS. 1 to 3 are diagrams illustrating a solar cell according to a first embodiment of the present invention.

FIG. 1 is a partial perspective view of the solar cell according to the first embodiment of the present invention, FIG. 2 is the entire cross-sectional view of the solar cell according to the first embodiment of the present invention, and FIG. 3 is the entire plan view of the back surface of the solar cell according to the first embodiment of the present invention.

Figure 4:
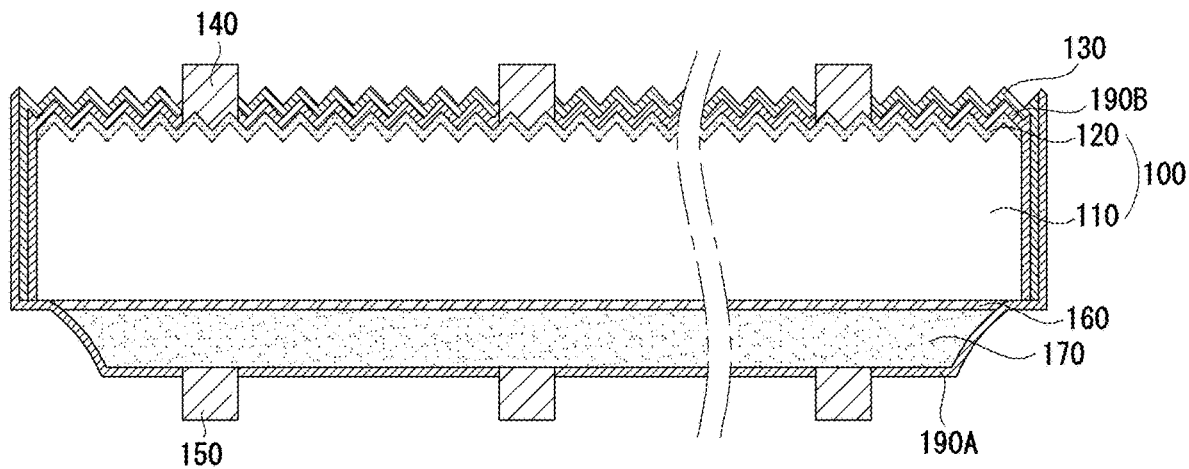
FIG. 4 is a cross-sectional view of a solar cell for illustrating a modified example of the first embodiment of the present invention.

Furthermore, FIG. 4 is a cross-sectional view of a solar cell for illustrating a modified example of the first embodiment of the present invention.

As shown in FIG. 1, an example of a solar cell according to an embodiment of the present invention includes a semiconductor substrate 100, a second conductive type semiconductor region 120, an anti-reflection layer 130, a tunnel layer 160, a first conductive type semiconductor region 170, a first passivation film 190A, a second passivation film 190B, a second electrode 140, and a first electrode 150.

In FIG. 1, the solar cell according to an embodiment of the present invention has been illustrated as including the anti-reflection layer 130 and the second passivation film 190B, but the anti-reflection layer 130 and the second passivation film 190B may be omitted in some embodiments. However, an example in which the anti-reflection layer 130 and the second passivation film 190B are included in the solar cell is described below because better efficiency is obtained if the anti-reflection layer 130 and the second passivation film 190B are included from a viewpoint of efficiency of the solar cell.

The semiconductor substrate 100 may be made of a crystalline semiconductor including a single semiconductor material (e.g., a group 4 element). For example, the semiconductor substrate 100 may be made of a single crystal or polycrystalline semiconductor (e.g., single crystal or polycrystalline silicon). In particular, the semiconductor substrate 100 may be made of a single crystal semiconductor (e.g., a single crystal semiconductor wafer, more specifically, a single crystal silicon wafer).

If the semiconductor substrate 100 is made of a single crystal semiconductor (e.g., single crystal silicon) as described above, the solar cell is based on the semiconductor substrate 100 made of a single crystal semiconductor having less defects because it has high crystallizability. Accordingly, the solar cell can have excellent electrical characteristics. In embodiments of the invention, crystallizability may refer to a degree to which a material may be crystallize or crystallizable, for example.

Furthermore, the front surface and/or back surface of the semiconductor substrate 100 may be textured and may have concave-convex portions. For example, an external surface of the concave-convex portions may be formed of the (111) face of the semiconductor substrate 100 and may have a pyramid shape having an irregular size.

If the concave-convex portions are formed in the front surface of the semiconductor substrate 100 by texturing as described above and thus the surface roughness of the front surface is increased, the reflectance of light incident through the front surface of the semiconductor substrate 100 can be reduced.

Accordingly, an optical loss can be minimized because the amount of light which reaches a pn junction formed by a base region 110 and the first or second conductive type semiconductor region 170 or 120 is increased. In the present embodiment, the concave-convex portions have been illustrated as being formed in the front and back surfaces of the semiconductor substrate 100, thereby effectively preventing the reflection of light incident through both surfaces.

However, the present invention is not limited to the example. Accordingly, as shown in FIG. 4, the concave-convex portions may be formed only in the front surface of the semiconductor substrate 100, and concave-convex portions may not be formed in the back surface of the semiconductor substrate 100.

In this instance, the back surface of the semiconductor substrate 100 in which the tunnel layer 160 is formed may be formed to have smaller surface roughness than the front surface thereof so that the tunnel layer 160 is formed more stably and uniformly.

Alternatively, the present invention may be modified in various ways, for example, concave-convex portions may not be formed in the front and back surfaces of the semiconductor substrate 100.

Referring back to FIG. 2, in the present embodiment, the semiconductor substrate 100 may include the base region 110 doped with impurities of a first or second conductive type at a low doping concentration and configured to have the first or second conductive type.

In this instance, the base region 110 of the semiconductor substrate 100 may have a lower doping concentration, higher resistance, or lower carrier concentration than one of the first and second conductive type semiconductor regions 170 and 120, which has the same conductive type as the base region 110.

The first conductive type semiconductor region 170 having the first conductive type may be placed on one surface (e.g., the back surface) of the semiconductor substrate 100. For example, the tunnel layer 160 may be formed on the semiconductor substrate 100, and the first conductive type semiconductor region 170 may be formed on the tunnel layer 160.

In this instance, the tunnel layer 160 may be disposed on the back surface of the semiconductor substrate 100 and may have a direct contact with the semiconductor substrate 100.

Such a tunnel layer 160 may be generally formed in portions other than an isolation portion I in the back surface of the semiconductor substrate 100. In this instance, "generally formed" may include "generally formed closely" and "some areas are not inevitably formed." Accordingly, the tunnel layer 160 can be easily formed because a separate patterning process is not required. However, the present invention is not limited to such an example.

Such a tunnel layer 160 may generate a tunneling effect. More specifically, the tunnel layer 160 may function as a kind of barrier for electrons and holes.

That is, the tunnel layer 160 may not transmit minority carriers. After the minority carriers are accumulated in a portion neighboring the tunnel layer 160, only majority carriers having energy of a specific level or higher may pass through the tunnel layer 160. The majority carriers having energy of a specific level or higher may easily pass through the tunnel layer 160 by a tunneling effect.

Furthermore, the tunnel layer 160 may also function as a diffusion barrier for preventing the dopant of the first conductive type semiconductor region 170 from being diffused into the semiconductor substrate 100. The tunnel layer 160 may include various materials through which majority carriers can be tunneled. For example, the tunnel layer 160 may include oxides, nitrides, a semiconductor, and a conductive polymer.

In particular, the tunnel layer 160 may be formed of a silicon oxide (SiOx) layer including silicon oxide. The reason for this is that the silicon oxide layer has an excellent passivation characteristic and carriers can easily tunnel through the silicon oxide layer.

In some embodiments, the tunnel layer 160 may be made of a dielectric material including SiCx having strong durability even in a high temperature process or may be made of SiNx, hydrogenated SiNx, AlOx, SiON, or hydrogenated SiON.

Furthermore, in order to sufficiently implement the tunneling effect, the thickness of the tunnel layer 160 may be smaller than the thickness of each of the first and the second passivation films 190A and 190B and the first and the second conductive type semiconductor regions 170 and 120.

For example, the thickness of the tunnel layer 160 may be 0.5 nm~2.5 nm. In this instance, the tunnel layer 160 may be formed by an oxidation process, an LPCVD process, or a PECVD deposition process, for example.

The thickness of the tunnel layer 160 is limited to the range of 0.5 nm~2.5 nm in order to implement the tunneling effect. The range of 0.5 nm~2.5 nm may be slightly exceeded. In this instance, however, the tunneling effect may be reduced.

More specifically, the tunnel layer 160 is formed to have the thickness of 0.5 nm or higher because it is practically very difficult to form the tunnel layer 160 having a thickness of less than 0.5 nm. Furthermore, the tunnel layer 160 is formed to have the thickness of 2.5 nm or less because the tunneling effect is meager if the thickness exceeds 2.5 nm.

The first conductive type semiconductor region 170 may be placed on the back surface of the semiconductor substrate 100, may include impurities of the first conductive type having a higher concentration than the impurities of the first conductive type included in the semiconductor substrate 100, and may include a polycrystalline silicon material.

That is, the first conductive type semiconductor region 170 may be formed on the back surface of the tunnel layer 160 formed on the back surface of the semiconductor substrate 100 and may be isolated from the semiconductor substrate 100, as shown in FIG. 1.

The first conductive type semiconductor region 170 may be brought into contact with and formed on the tunnel layer 160, thereby simplifying the structure of the solar cell and maximizing the tunneling effect of the tunnel layer 160.

If the first conductive type semiconductor region 170 is not formed within the semiconductor substrate 100, the first conductive type semiconductor region 170 is formed on the back surface of the semiconductor substrate 100, but spaced apart from the semiconductor substrate 100 as shown in FIGS. 1 and 2, and the first conductive type semiconductor region 170 includes a polycrystalline silicon material formed on the back surface of the tunnel layer 160, the open voltage Voc of the solar cell can be further improved.

Furthermore, the first conductive type semiconductor region 170 is not formed within the semiconductor substrate 100, but is formed outside the semiconductor substrate 100. Accordingly, the characteristics of the semiconductor substrate 100 can be prevented from being deteriorated because thermal damage to the semiconductor substrate 100 is minimized in the process of forming the first conductive type semiconductor region 170 from a viewpoint of a manufacturing process. Accordingly, an embodiment of the present invention can further improve efficiency of the solar cell.

The thickness of the first conductive type semiconductor region 170 may be 50 nm~500 nm.

The first conductive type semiconductor region 170 may include the same semiconductor material (more specifically, a silicon semiconductor material) as the semiconductor substrate 100. Accordingly, a difference between the characteristics of the second conductive type semiconductor region 120 and the semiconductor substrate 100 can be minimized because the second conductive type semiconductor region 120 has similar characteristics as the semiconductor substrate 100.

In this instance, since the first conductive type semiconductor region 170 is formed on the semiconductor substrate 100 separately from the semiconductor substrate 100, the first conductive type semiconductor region 170 may have a crystal structure different from the crystal structure of the semiconductor substrate 100 so that it is easily formed on the semiconductor substrate 100.

For example, the first conductive type semiconductor region 170 may be formed by doping impurities of the first conductive type into an amorphous silicon material, a fine crystal silicon material, or a polycrystalline silicon material which may be easily manufactured using various methods, such as deposition.

In particular, if the first conductive type semiconductor region 170 includes a polycrystalline silicon material, carriers can smoothly move because the first conductive type semiconductor region 170 has excellent electrical conductivity and the tunneling of carriers can be smoothly generated in the tunnel layer 160 made of oxide.

The second conductive type semiconductor region 120 is placed on the opposite surface of the semiconductor substrate 100, for example, on the front surface of the semiconductor substrate 100 on which light is incident. The second conductive type semiconductor region 120 may include impurities of the second conductive type which is opposite the conductive type of the semiconductor substrate 100, for example, a conductive type of an n type.

For example, in the present embodiment, the second conductive type semiconductor region 120 may be formed into a doping region formed by doping impurities of the second conductive type into part of the semiconductor substrate 100.

For example, the second conductive type semiconductor region 120 may be formed by diffusing the impurities of the second conductive type into the front surface of the semiconductor substrate 100. In this instance, the second conductive type semiconductor region 120 may be made of the same silicon material as the semiconductor substrate 100.

For example, if the semiconductor substrate 100 is formed of a wafer made of a polycrystalline silicon material, the second conductive type semiconductor region 120 may also be made of a polycrystalline silicon material. Furthermore, the second conductive type semiconductor region 120 in which the semiconductor substrate 100 is formed of a wafer made of a single crystal silicon material may also be made of a single crystal silicon material.

The base region 110 and the second conductive type semiconductor region 120 may have the same crystal structure and semiconductor material as the semiconductor substrate 100, but may have different conductive types or different doping concentrations.

More specifically, if the base region 110 has the first conductive type, the base region 110 and the second conductive type semiconductor region 120 may have different conductive types. If the base region 110 has the second conductive type, the second conductive type semiconductor region 120 may have a higher doping concentration than the base region 110.

If the base region 110 has the first conductive type, the first conductive type semiconductor region 170 having the first conductive type has the same conductive type as the semiconductor substrate 100 and may form a back surface field (BSF) region which has a higher doping concentration than the semiconductor substrate 100 and forms a BSF. The second conductive type semiconductor region 120 having the second conductive type has a conductive type different from that of the base region 110 and may form an emitter region forming a pn junction along with the base region 110.

Accordingly, the second conductive type semiconductor region 120 forming the emitter region is placed on the front surface side of the semiconductor substrate 100, thereby being capable of minimizing the path of light regioned with the pn junction.

However, the present invention is not limited to the example. For example, if the base region 110 has the second conductive type, the first conductive type semiconductor region 170 forms the emitter region, and the second conductive type semiconductor region 120 has the same conductive type as the semiconductor substrate 100 and may form a front surface field (FSF) region which has a higher doping concentration than the semiconductor substrate 100 and forms a FSF.

A p type dopant used as the impurities of the first or second conductive type may include group 3 elements, such as boron (B), aluminum (Al), gallium (Ga), and indium (In). An n type dopant used as the impurities of the first or second conductive type may include group 5 elements, such as phosphorous (P), arsenic (As), bismuth (Bi), and antimony (Sb). However, the present invention is not limited to the examples, and various dopants may be used as the impurities of the first or second conductive type.

In the present embodiment, the first conductive type semiconductor region 170 formed separately from the semiconductor substrate 100 may be placed on the back surface side of the semiconductor substrate 100, and the second conductive type semiconductor region 120 forming part of the semiconductor substrate 100 may be placed on the front surface side of the semiconductor substrate 100.

If the first conductive type semiconductor region 170 having a crystal structure different from that of the semiconductor substrate 100 is placed on the front surface side of the semiconductor substrate 100, the amount of light reaching the pn junction may be reduced because the absorption of light in the first conductive type semiconductor region 170 is increased. Accordingly, the first conductive type semiconductor region 170 may be placed on the back surface side of the semiconductor substrate 100, but the present invention is not limited thereto.

The passivation films 190A and 190B may be generally formed on the first and the second conductive type semiconductor regions 170 and 120 other than opening portions 102 and 104 respectively corresponding to the first and the second electrodes 150 and 140. Each of the passivation films 190A and 190B may be formed of an undoped passivation film not separately including a dopant.

More specifically, the first passivation film 190A may be generally formed on (e.g., brought into contact with) the portions of the first conductive type semiconductor region 170 other than the opening portion 102. The second passivation film 190B may be generally formed on (e.g., brought into contact with) the portions of the second conductive type semiconductor region 120 other than the opening portion 104.

Furthermore, the anti-reflection layer 130 may be placed on the second passivation film 190B.

The passivation films 190A and 190B are brought into contact with and formed on the first and the second conductive semiconductor regions 170 and 120, thereby being capable of immobilizing defects present in the first and the second conductive type semiconductor regions 170 and 120.

Accordingly, the open voltage Voc of the solar cell can be increased because the recombination sites of minority carriers are removed. The anti-reflection layer 130 can reduce the reflectance of light incident on the front surface of the semiconductor substrate 100.

Accordingly, the amount of light reaching the pn junction formed at the interface of the base region 110 and the first conductive type semiconductor region 170 can be increased because the reflectance of light incident through the front surface of the semiconductor substrate 100 is lowered. Accordingly, the short circuit current Isc of the solar cell can be increased. As a result, efficiency of the solar cell can be improved because the open voltage and short circuit current of the solar cell are increased by the passivation films 190A and 190B and the anti-reflection layer 130 as described above.

For example, the passivation film 190A, 190B or the anti-reflection layer 130 may have a single film selected from the group consisting of a silicon nitride film, a silicon nitride film including hydrogen, a silicon oxide film, a silicon oxynitride film, an aluminum oxide film, $MgF_2$, ZnS, $TiO_2$, and $CeO_2$ or may have a multi-layer structure in which two or more films selected from the group are combined.

For example, if a contacted conductive semiconductor region of the first and the second conductive semiconductor regions 170 and 120 has an n type, a corresponding one of the first and the second passivation films 190A and 190B may include a silicon oxide film or a silicon nitride film having fixed positive charges. If the contacted conductive semiconductor region has a p type, the corresponding passivation film may include an aluminum oxide film having fixed negative charges. Furthermore, the anti-reflection layer 130 may include silicon nitride, for example.

More specifically, in an embodiment of the present invention, the first passivation film 190A brought into contact with the first conductive type semiconductor region 170 may be formed of a silicon nitride film, may have a refractive index of 1.9~2.1, and may have a thickness of 30 nm~50 nm.

Furthermore, the second passivation film 190B brought into contact with the second conductive type semiconductor region 120 may have a dual-layer structure in which an aluminum oxide film and a silicon nitride film are sequentially stacked on the second conductive type semiconductor region 120. In this instance, the aluminum oxide film may have a refractive index of 1.5~1.7 and a thickness of 5 nm~10 nm. The silicon nitride film of the second passivation film 190B may have a refractive index of 1.9~2.1 and a thickness of 70 nm~120 nm.

However, the present invention is not limited to the examples. The passivation films 190A and 190B and the anti-reflection layer 130 may include various materials.

The first electrode 150 is placed on (e.g., brought into contact with) on the first conductive type semiconductor region 170 and electrically connected to the first conductive type semiconductor region 170. The first electrode 150 may be electrically connected to the first conductive type semiconductor region 170 through the opening portion 102 formed in the first passivation film 190A (i.e., by penetrating the first passivation film 190A).

In this instance, the first electrode 150 penetrates the first passivation film 190A and is connected to the first conductive type semiconductor region 170, but may be connected to a surface of the first conductive type semiconductor region 170.

Likewise, the second electrode 140 is placed on (e.g., brought into contact with) the second conductive type semiconductor region 120 and electrically connected to the second conductive type semiconductor region 120. The second electrode 140 may be electrically connected to the first conductive type semiconductor region 170 through the opening portion 104 formed in the second passivation film 190B and the anti-reflection layer 130 (i.e., through the second passivation film 190B and the anti-reflection layer 130).

The first and the second electrodes 150 and 140 may include various materials (more specifically, metal) and may have various shapes.

For example, the first electrode 150 may include a plurality of first finger electrodes 151 and a plurality of first bus bars 153, as shown in FIG. 1.

The plurality of first finger electrodes 151 may be spaced apart from each other on the back surface of the first conductive type semiconductor region 170, may be extended in a first direction x, and may collect carriers moved toward the first conductive type semiconductor region 170.

Furthermore, the plurality of first bus bars 153 may be placed on the same layer as the plurality of first finger electrodes 151 on the first conductive type semiconductor region 170, may electrically connect the plurality of first finger electrodes 151, and may be extended in a second direction y crossing the plurality of first finger electrodes 151.

Furthermore, the second electrode 140 may include a plurality of second finger electrodes 141 and a plurality of second bus bars 143, as shown in FIG. 1.

The plurality of second finger electrodes 141 may be placed on the second conductive type semiconductor region 120, may be electrically connected to the second conductive type semiconductor region 120, may be spaced apart from each other, and may be extended in the first direction x.

The plurality of second finger electrodes 141 may collect carriers, for example, holes moved toward the second conductive type semiconductor region 120.

Furthermore, the plurality of second bus bars 143 may be placed on the same layer as the plurality of second finger electrodes 141 on the second conductive type semiconductor region 120, may electrically connect the plurality of second finger electrodes 141, and may be extended in the second direction y crossing the plurality of second finger electrodes 141.

In the solar cell having such a structure, the tunnel layer 160 and the first conductive type semiconductor region 170 placed on the back surface of the semiconductor substrate 100 may be spaced apart from the edge of the back surface of the semiconductor substrate 100 (or the side of the semiconductor substrate 100) at a first distance D1.

Accordingly, the area of each of the tunnel layer 160 and the first conductive type semiconductor region 170 may be smaller than the area of the semiconductor substrate 100. The first distance D1 may mean the shortest distance of distances between the edge of the back surface of the semiconductor substrate 100 and the tunnel layer 160 and the first conductive type semiconductor region 170.

That is, the isolation portion I in which the tunnel layer 160 and the first conductive type semiconductor region 170 (including the first electrode 150 connected to the first conductive type semiconductor region 170 in addition to the tunnel layer 160 and the first conductive type semiconductor region 170) are not formed may be placed at the edge of the back surface of the semiconductor substrate 100. In this instance, the first passivation film 190A may be formed to cover one surface of the semiconductor substrate 100, including the isolation portion I.

The isolation portion I may block a contact between the first conductive type semiconductor region 170 and the second conductive type semiconductor region 120 in any one of the first surface, side, and second surface of the semiconductor substrate 100. For example, the isolation portion I may function as an edge isolator for isolating the first conductive type semiconductor region 170 from the edge of the back surface of the semiconductor substrate 100.

That is, when the second conductive type semiconductor region 120 is formed, the impurities of the second conductive type may be diffused into the side of or the edge of the back surface of the semiconductor substrate 100, and thus the first conductive type semiconductor region 170 and the second conductive type semiconductor region 120 may be unwantedly short-circuited in the side of or the edge of the back surface of the semiconductor substrate 100. In the present embodiment, such a problem can be fundamentally prevented by removing the first conductive type semiconductor region 170 from the edge of the back surface of the semiconductor substrate 100.

Furthermore, the area of the second conductive type semiconductor region 120 can be maximized because the second conductive type semiconductor region 120 is generally formed on the front surface of the semiconductor substrate 100.

The isolation portion I may be formed in the entire edge of the back surface of the semiconductor substrate 100 and may have a closed shape, as shown in FIG. 3. Furthermore, a specific step or operation is present between portions in which the isolation portion I and the tunnel layer 160 and the first conductive type semiconductor region 170 have been formed.

For example, the first distance D1 (i.e., the width of the isolation portion I) may be 1 mm or less. If the first distance D1 exceeds 1 mm, efficiency may be deteriorated because the area of the first conductive type semiconductor region 170 is reduced. For example, the first distance D1 may be 1 nm to 1 mm. If the first distance D1 is less than 1 mm, the effect of the isolation portion I may not be sufficient. However, the present invention is not limited to the above values. The first distance D1 may have a different value depending on the size of the semiconductor substrate 100, for example.

The first conductive type semiconductor region 170 may have a shape having a smaller area as the first conductive type semiconductor region 170 becomes distant from the semiconductor substrate 100. In this instance, the side of the first conductive type semiconductor region 170 may be formed to be not vertical to the semiconductor substrate 100 (e.g., approximately slanted) as the first conductive type semiconductor region 170 becomes distant from the semiconductor substrate 100.

That is, as shown in FIG. 2, the thickness of the edge region of the first conductive type semiconductor region 170 may be gradually decreased toward the isolation portion I.

For example, the area of the first conductive type semiconductor region 170 may be reduced as the first conductive type semiconductor region 170 becomes distant from the semiconductor substrate 100, so the side of the first conductive type semiconductor region 170 may be formed to be rounded. The side of the tunnel layer 160 may be placed so that it is extended along with the side of the first conductive type semiconductor region 170 and may have a rounded shape similar to the first conductive type semiconductor region 170.

The reason for this is that a wet process is used in the process of forming the isolation portion I by removing the first conductive type semiconductor region 170 and the tunnel layer 160. This is described later. In some embodiments, the sides of the first conductive type semiconductor region 170 and the tunnel layer 160 may have various shapes in addition to the rounded shape.

Furthermore, the first passivation film 190A placed on the back surface side of the semiconductor substrate 100 may be placed on the first conductive type semiconductor region 170 in the portion in which the tunnel layer 160 and the first conductive type semiconductor region 170 are present and may come into contact with the back surface of the semiconductor substrate 100 in the isolation portion I.

That is, the first passivation film 190A may be directly brought into contact with and formed on the back surface of the semiconductor substrate 100 near the edge of the semiconductor substrate 100, may be extended from the edge of the semiconductor substrate 100, may be brought into contact with and formed on the sides of the tunnel layer 160 and the first conductive type semiconductor region 170 while covering the sides, may be extended from the sides, and may be brought into contact with and formed on the top surface of the first conductive type semiconductor region 170 while covering the top surface.

In an embodiment of the present invention, in the process of manufacturing the solar cell, the isolation portion I may be formed by removing the tunnel layer 160 and the first conductive type semiconductor region 170 placed in the edge of the back surface of the semiconductor substrate 100.

Accordingly, the first passivation film 190A may be formed to cover an edge portion of the back surface of the semiconductor substrate 100 which has been exposed by removing the tunnel layer 160 and the second conductive type semiconductor region 160, that is, the isolation portion I.

Accordingly, the isolation portion I can prevent a passivation characteristic from being deteriorated. In this instance, the structure of the solar cell and the process of manufacturing the solar cell can be simplified because the first passivation film 190A is used without forming a separate film for protecting the isolation portion I.

Furthermore, the first passivation film 190A may include a side portion 190Aa extended up to the top of the side of the semiconductor substrate 100. If the side portion 190Aa of the first passivation film 190A is used, the first passivation film 190A may be formed to cover the upper side of the back surface of the semiconductor substrate 100 generally and stably.

Furthermore, the second passivation film 190B and the anti-reflection layer 130 may include side portions 190Ba and 130a extended up to the top of the side of the semiconductor substrate 100.

In this instance, the second passivation film 190B may be placed close to the semiconductor substrate 100 on the side of the semiconductor substrate 100, and the first passivation film 190A may be placed on the second passivation film 190B.

More specifically, the side portion 190Ba of the second passivation film 190B may come into contact with the side of the semiconductor substrate 100. The side portion 130a of the anti-reflection layer 130 may come into contact with the side portion 190Ba of the second passivation film 190B. The side portion 190Aa of the first passivation film 190A may come into contact with the side portion 130a of the anti-reflection layer 130.

Accordingly, the second conductive type semiconductor region 120 can be stably passivated because the second passivation film 190B is first formed and the first passivation film 190A is then formed in the process of forming the first passivation film 190A. This is described in more detail later.

However, the present invention is not limited to the example. For example, at least one of the side portions 190Aa, 190Ba, and 130a may not be provided on the side of the semiconductor substrate 100, or sequence in which the side portions 190Aa, 190Ba, and 130a are stacked may be changed.

A plane shape of the first electrode 150 is described in detail with reference to FIG. 3, and a plane shape of the second electrode 140 is then described in detail.

Referring to FIG. 3, the first electrode 150 may include the plurality of first finger electrodes 151 spaced apart from each other at a specific pitch. In FIG. 3, the first finger electrodes 151 have been illustrated as being parallel and as being parallel in the edge of the semiconductor substrate 100, but the present invention is not limited thereto.

Furthermore, only one first bus bar 153 may be included. As shown in FIG. 3, a plurality of the first bus bars 153 having a pitch greater than the pitch between the first finger electrodes 151 may be included.

The width of the first bus bar 153 may be greater than the width of the first finger electrode 151, but the present invention is not limited thereto. Accordingly, the width of the first bus bar 153 may be the same as or smaller than the width of the first finger electrode 151.

When viewed from a cross section, both the first finger electrodes 151 and first bus bar 153 of the first electrode 150 may be formed to penetrate the first passivation film 190A. That is, the opening portion 102 may be formed in accordance with all of the first finger electrodes 151 and first bus bar 153 of the first electrode 150.

However, the present invention is not limited to the example. For example, the first finger electrodes 151 of the first electrode 150 may be formed to penetrate the first passivation film 190A, and the first bus bar 153 may be formed on the first passivation film 190A. In this instance, the opening portion 102 may be formed to have a shape corresponding to the first finger electrodes 151, but may not be formed in a portion in which only the first bus bar 153 is placed.

As described above, in the present embodiment, the isolation portion I may be formed in the portion in which the tunnel layer 160 and the first conductive type semiconductor region 170 are not formed along the edge of the semiconductor substrate 100. Accordingly, the first electrode 150 formed on the first conductive type semiconductor region 170 may not be formed in the isolation portion I.

Accordingly, the ends of the first finger electrodes 151 and bus bar 153 of the first electrode 150 may be spaced apart from the edge of the semiconductor substrate 100 at least at the first distance D1.

Furthermore, the second finger electrodes 141 and second bus bar 142 of the second electrode 140 may be respectively formed in accordance with the first finger electrodes 151 and first bus bar 153 of the first electrode 150.

The contents described in connection with the first finger electrodes 151 and first bus bar 153 of the first electrode 150 may be applied to the second finger electrodes 141 and second bus bar 142 of the second electrode 140 without a change except the contents described in connection with the isolation portion I.

Furthermore, the contents related to the first passivation film 190A in the first electrode 150 may be applied to the second passivation film 190B and the anti-reflection layer 130 in the second electrode 140 without a change.

In this instance, the width and pitch of the first finger electrodes 151 and first bus bar 153 of the first electrode 150 may be the same as or different from the width and pitch of the second finger electrodes 141 and second bus bar 142 of the second electrode 140.

However, the present invention is not limited to the example. For example, the first electrode 150 and the second electrode 140 may have different plane shapes and may be modified in various ways.

As described above, in the present embodiment, since the first and the second electrodes 150 and 140 of the solar cell have a specific pattern, the solar cell has a bi-facial structure in which light may be incident on the front and back surfaces of the semiconductor substrate 100.

Accordingly, efficiency of the solar cell can be improved because the amount of light used in the solar cell is increased. However, the present invention is not limited to the bi-facial structure. For example, the solar cell may have a structure in which the first electrode 150 is generally formed on the back surface side of the semiconductor substrate 100 and may have various structures.

In this instance, if the isolation portion I is formed on the back surface of the semiconductor substrate 100, the first conductive type semiconductor region 170 and the second conductive type semiconductor region 120 can be effectively prevented from being unnecessarily interconnected.

Furthermore, a surface of the semiconductor substrate 100 on which the isolation portion I is placed may be covered and passivated by the first passivation film 190A covering the first conductive type semiconductor region 170.

Accordingly, problems attributable to surface recombination can be minimized because the isolation portion I is passivated by such a simple structure. That is, efficiency and reliability of a solar cell can be improved and a defective ratio of the solar cell can be reduced by the simple structure.

In the first embodiment of the present invention, an example in which the first electrode 150 penetrates the first passivation film 190A and the first electrode 150 is connected to the first conductive type semiconductor region 170, but is connected to a surface of the first conductive type semiconductor region 170 has been described.

In some embodiments, however, the first electrode 150 penetrates the first passivation film 190A and is connected to the first conductive type semiconductor region 170, but at least part of the first electrode 150 may be depressed and formed in the first conductive type semiconductor region 170. This is described in more detail below.

Figure 5:
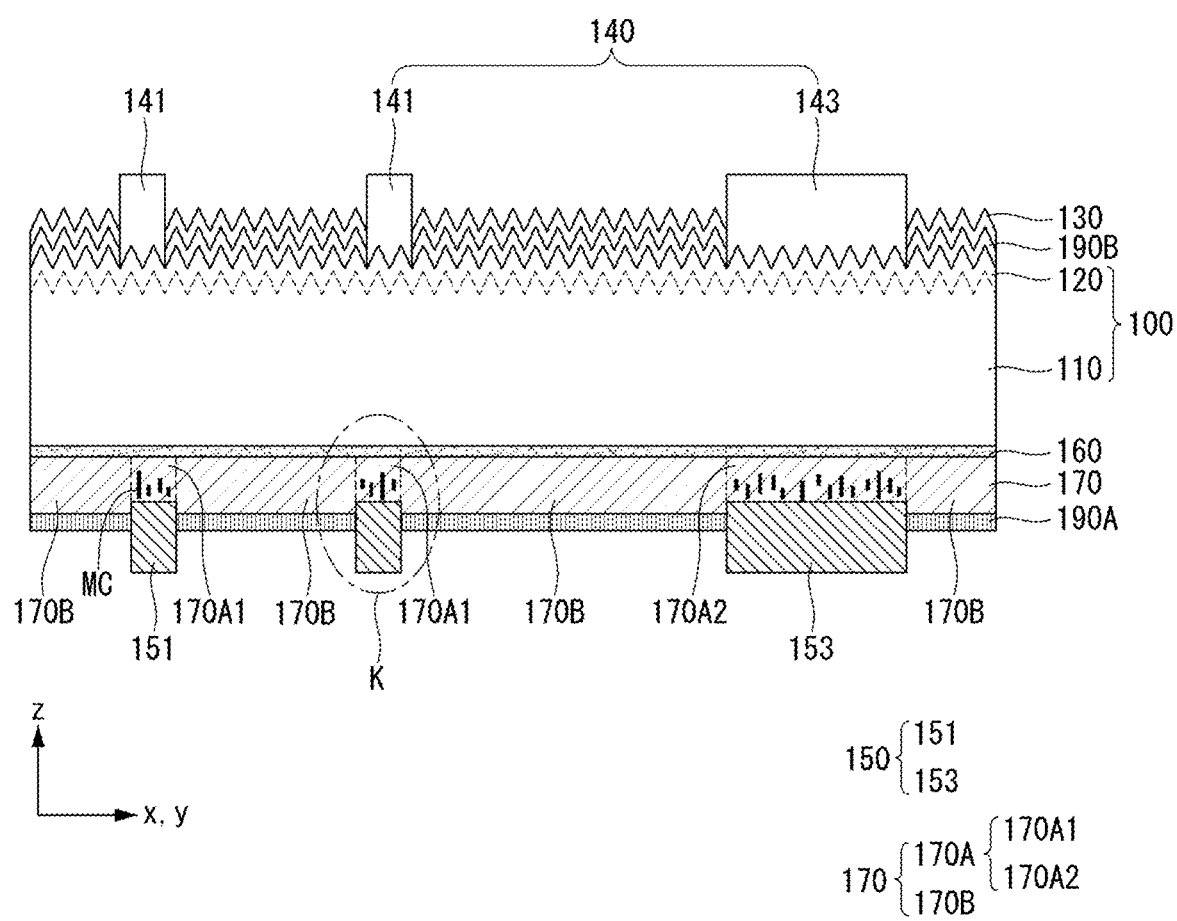
FIGS. 5 to 7 depict a solar cell according to a second embodiment of the present invention.
Figure 6:
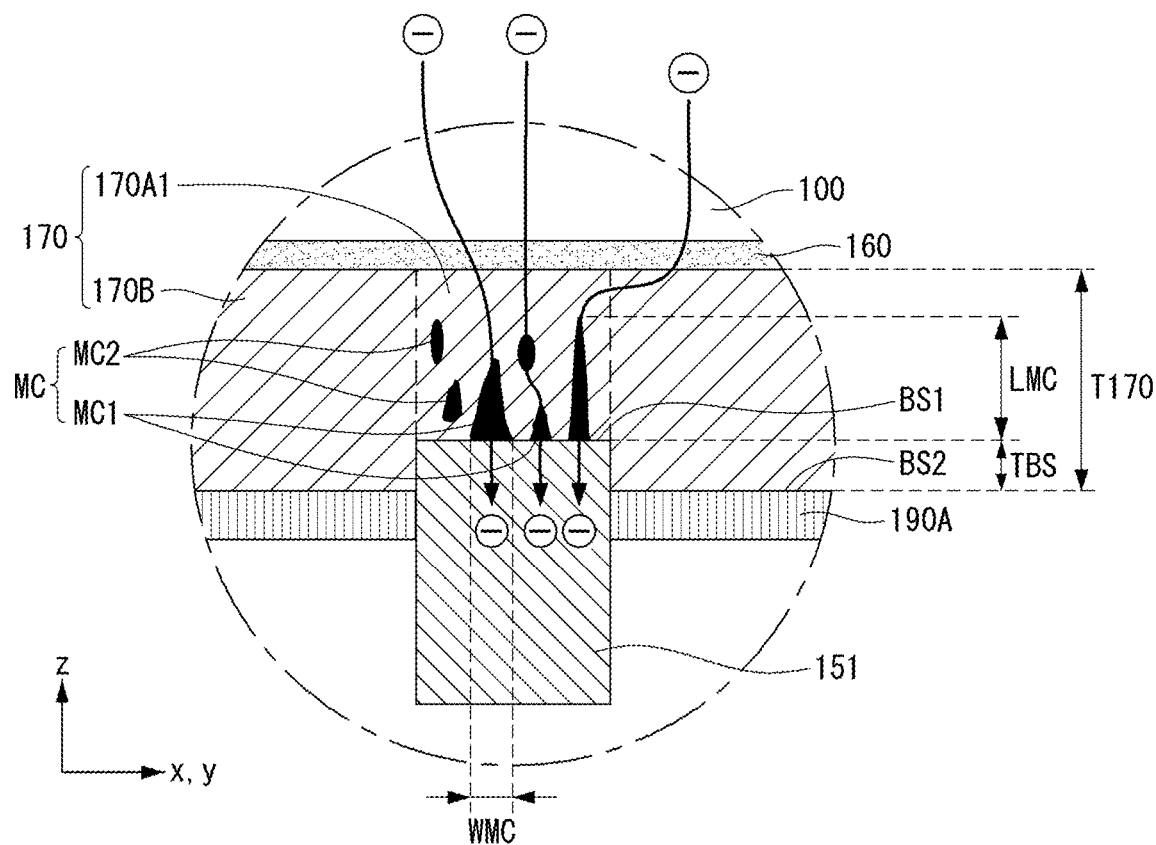
Figure 7:
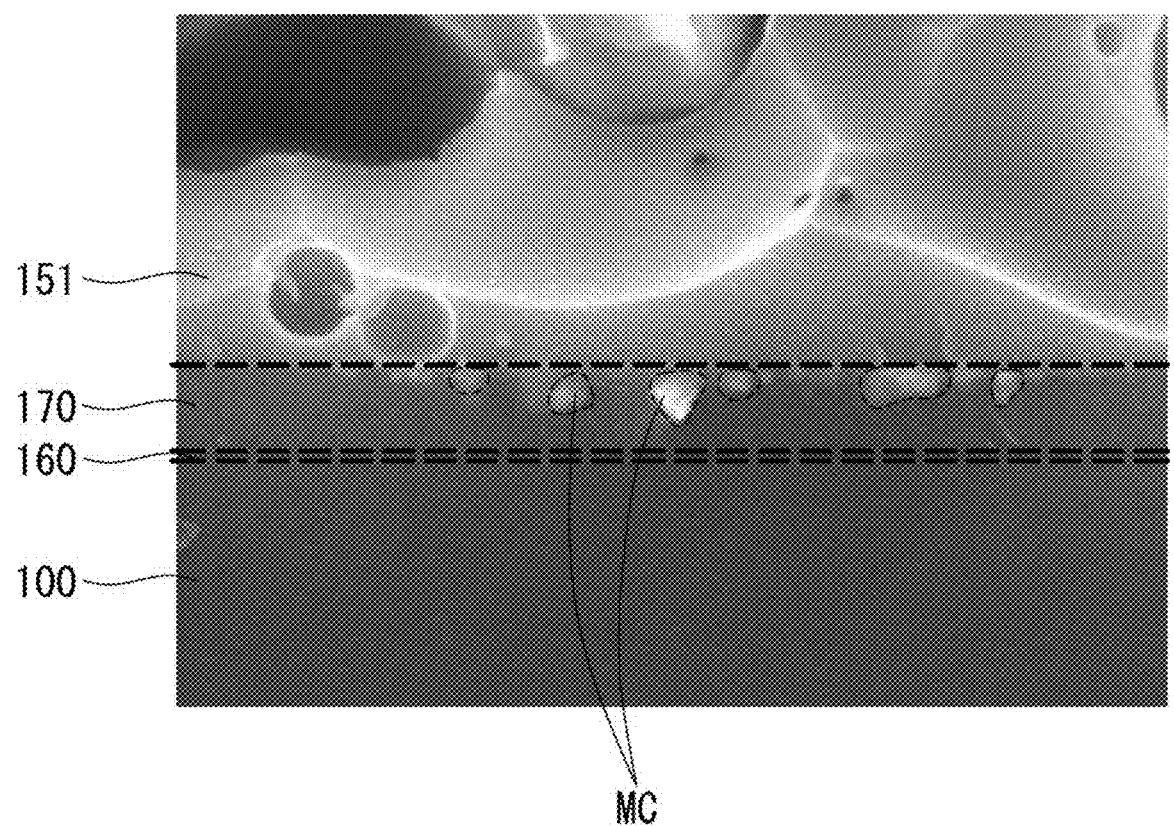

FIGS. 5 to 7 depict a solar cell according to a second embodiment of the present invention.

FIG. 5 is a cross-sectional view of the solar cell taken along line II-II of FIG. 1. Furthermore, FIG. 6 is an enlarged view of a portion K in FIG. 5, and FIG. 7 is a real photograph of a contact portion between the first electrode 150 and the first conductive type semiconductor region 170.

Figure 8:
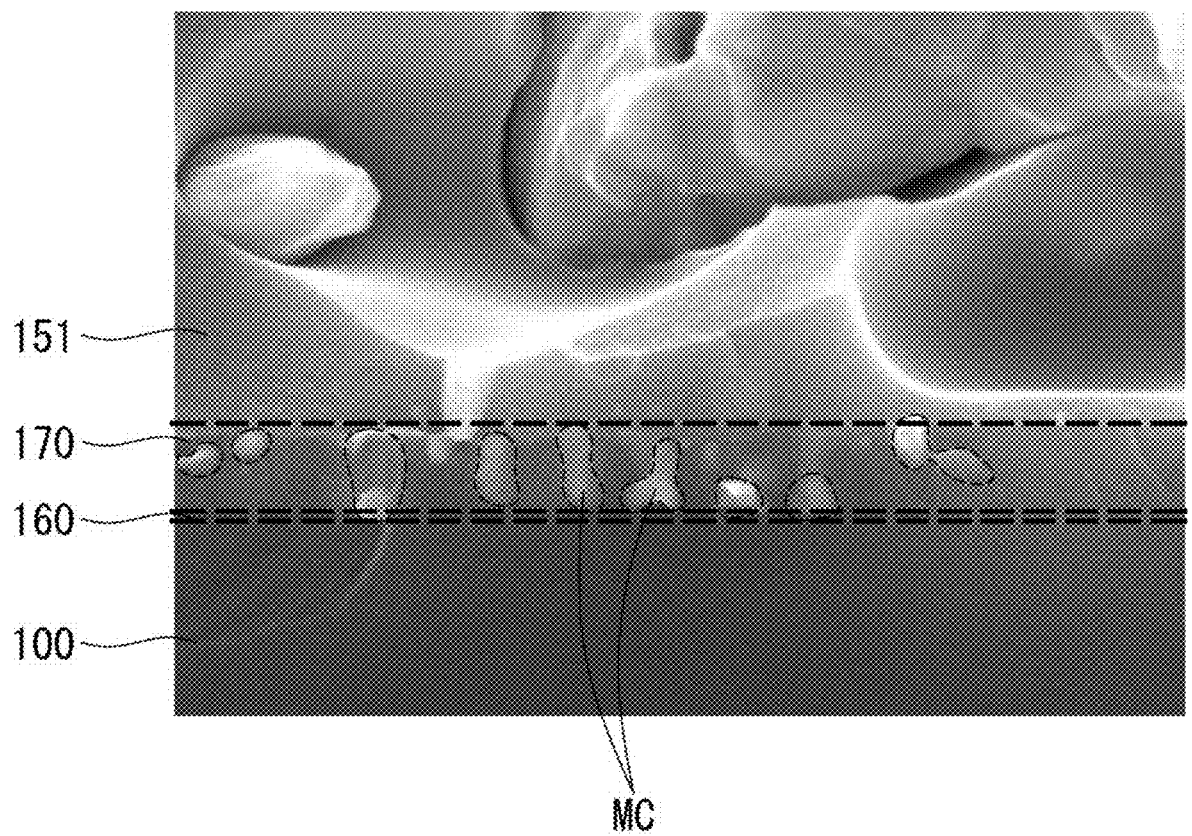
FIG. 8 depicts a comparison example different from the second embodiment of the present invention.

Furthermore, FIG. 8 depicts a comparison example different from the second embodiment of the present invention.

A description of contents redundant with the contents described with reference to FIGS. 1 to 4 is omitted.

For reference, in FIG. 5, a region that belongs to the first conductive type semiconductor region 170 and that is placed in the space between the first finger electrode 151 and the tunnel layer 160 is called a finger forming region 170A1. A region that belongs to the first conductive type semiconductor region 170 and that is placed in the space between the first bus bar 153 and the tunnel layer 160 is called a bus bar forming region 170A2. The remaining regions of the first conductive type semiconductor region 170 other than the finger forming region 170A1 and the bus bar forming region 170A2 is called a non-forming region 170B. Furthermore, the finger forming region 170A1 and the bus bar forming region 170A2 are collectively called an electrode forming region 170A.

In the solar cell according to the second embodiment of the present invention, at least part of the first electrode 150 may penetrate the first passivation film 190A and may be depressed into the first conductive type semiconductor region 170 and electrically connected to the first conductive type semiconductor region 170, as shown in FIGS. 5 and 6.

For example, both the first finger electrode 151 and first bus bar 153 of the first electrode 150 may be depressed and formed in the first conductive type semiconductor region 170.

In other words, as shown in FIG. 6, the location of a first boundary surface BS1 in which the first conductive type semiconductor region 170 and the first electrode 150 come into contact with each other may be more depressed and formed toward the semiconductor substrate 100 than the location of a second boundary surface BS2 in which the first conductive type semiconductor region 170 and the first passivation film 190A come into contact with each other.

Accordingly, the distance between the semiconductor substrate 100 and the first boundary surface BS1 may be smaller than the distance between the semiconductor substrate 100 and the second boundary surface BS2.

In this instance, all of the plurality of first finger electrodes 151 and the first bus bar 153 may be formed to have a single layer or double layer structure. In some embodiments, the plurality of first finger electrodes 151 may be formed to have a single layer structure, and the first bus bar 153 may be formed to have a double layer structure.

In FIG. 6, the first finger electrode 151 has been illustrated as being an example. Like the first finger electrode 151, the first bus bar 153 may have the same structure in which it has been depressed into the first conductive type semiconductor region 170.

As described above, the structure in which the first electrode 150 has been depressed into the first conductive type semiconductor region 170 may be formed when a paste for the first electrode perforates the first passivation film 190A and penetrates the first conductive type semiconductor region 170 in a thermal treatment process in the state in which the paste for the first electrode for forming the first electrode 150 has been patterned and formed on the back surface of the first passivation film 190A.

If the first electrode 150 is formed by the process of printing and thermally treating the paste for the first electrode as described above, there are advantages in that a cost is relatively low compared to a plating method and a process time can be reduced.

In this instance, a difference TBS between the heights of the first boundary surface BS1 and the second boundary surface BS2 may be set to 1 nm~20 nm. The difference between the heights of the first and the second boundary surfaces BS1 and BS2 may vary depending on the time taken for the thermal treatment process for forming the first electrode 150 and content of frit glass included in the paste for the first electrode.

FIGS. 5 and 6 have illustrated an example in which all of the plurality of first bus bars 153 and the plurality of first finger electrodes 151 forming the first electrode 150 have been depressed into the first conductive type semiconductor region 170.

However, the present invention is not necessarily limited to the example. For example, only the plurality of first finger electrodes 151 of the first electrode 150 may be depressed and formed in the first conductive type semiconductor region 170. The example in which only the plurality of first finger electrodes 151 has been depressed into the first conductive type semiconductor region 170 as described above is described in detail later with reference to FIG. 9 and related drawings.

Accordingly, in the solar cell according to an embodiment of the present invention, as shown in FIG. 6, the first electrode 150 may be depressed into the first conductive type semiconductor region 170, and the first conductive type semiconductor region 170 and the first electrode 150 may come into contact with each other in the first boundary surface BS1 of the first conductive type semiconductor region 170.

In this instance, as shown in FIG. 5, a plurality of metal crystals MC extracted from the first electrode 150 may be placed in the electrode forming region 170A of the first conductive type semiconductor region 170 in which the first electrode 150 has been formed, as described above.

For example, as shown in FIG. 6, the plurality of metal crystals MC extracted from the first finger electrode 151 may be placed in the finger forming region 170A1 of the first conductive type semiconductor region 170 in which the first finger electrode 151 is formed.

Only the electrode finger forming region 170A1 of the electrode forming region 170A of the first conductive type semiconductor region 170 has been illustrated in FIG. 6. Likewise, the plurality of metal crystals MC extracted from the first bus bar 153 may be placed in the bus bar forming region 170A2, as shown in FIG. 5.

The plurality of metal crystals MC has relatively low resistance compared to the first conductive type semiconductor region 170 made of polycrystalline silicon. Accordingly, as shown in FIG. 6, carriers which have moved from the semiconductor substrate 100 to the first conductive type semiconductor region 170 through the tunnel layer 160, for example, electrons may directly move to the first electrode 150 through the metal crystals MC or may jump between the metal crystals MC and the metal crystals MC and move to the first electrode 150.

Accordingly, the plurality of metal crystals MC may function to help carriers to move to the first electrode 150 more easily.

Accordingly, the metal crystals MC may narrow a substantial distance between the semiconductor substrate 100 and the first electrode 150 due to its low resistance.

Furthermore, when the first electrode 150 is connected to the first conductive type semiconductor region 170, the metal crystals MC are formed in the direction of the semiconductor substrate 100 on the basis of the first boundary surface BS1, that is, the boundary of the first electrode 150 and the first conductive type semiconductor region 170. Accordingly, contact resistance between the first electrode 150 and the first conductive type semiconductor region 170 can be further lowered.

Accordingly, if the plurality of metal crystals MC is further included in the first conductive type semiconductor region 170 between the first electrode 150 and the tunnel layer 160 as in the embodiment of the present invention shown in FIG. 6, efficiency of the solar cell can be further improved.

As shown in FIG. 5, the metal crystals MC may be placed in the electrode forming region 170A of the first conductive type semiconductor region 170 in which the first electrode 150 has been formed, but may not be placed in the non-forming region 170B of the first conductive type semiconductor region 170 in which the first electrode 150 has not been formed.

The reason why the metal crystals MC are placed in the electrode forming region 170A of the first conductive type semiconductor region 170, but are not placed in the non-forming region 170B of the first conductive type semiconductor region 170 as described above is that metal extracted from the first electrode 150 during the thermal treatment process for forming the first electrode 150 is recrystallized to form the plurality of metal crystals MC.

For example, the plurality of first electrodes 150 may be formed to include at least one conductive metal material. In this instance, the conductive metal material included in the plurality of first electrodes 150 may be at least one selected from the group consisting of nickel (Ni), copper (Cu), silver (Ag), aluminum (Al), tin (Sn), zinc (Zn), indium (In), titanium (Ti), and gold (Au) and a combination of them, for example, but may include other conductive metal materials.

In this instance, the plurality of metal crystals MC may include the same metal material as a metal material included in the first electrode 150 because the metal crystals MC are formed when the metal material included in the first electrode 150 is extracted and recrystallized.

Accordingly, if the first electrode 150 includes silver (Ag), for example, the metal crystals MC may also include silver (Ag).

Furthermore, as shown in FIGS. 6 and 7, the metal crystals MC are placed in the first conductive type semiconductor region 170, but may not be placed in the tunnel layer 160.

That is, if the metal crystals MC are placed in the tunnel layer 160 as in the comparison example of FIG. 8, the functions of the tunnel layer 160 may be deteriorated. If the metal crystals MC penetrate the back surface of the semiconductor substrate 100 through the tunnel layer 160, an open voltage (Voc) characteristic appearing due to the structure of the semiconductor substrate 100—the tunnel layer 160—the first conductive type semiconductor region 170 may be deteriorated, thereby being capable of deteriorating the semiconductor substrate 100.

If the semiconductor substrate 100 is deteriorated as described above, a characteristic of the semiconductor substrate 100, for example, a characteristic, such as a carrier life time, may be deteriorated.

If the metal crystals MC are placed in the first conductive type semiconductor region 170, but are not placed in the tunnel layer 160 as in the embodiment of the present invention, however, the deterioration of the characteristic described above can be prevented.

As shown in FIG. 6, some metal crystals MC1 of the plurality of metal crystals MC may have a direct contact with the first electrode 150. Furthermore, at least one metal crystal MC2 of the plurality of metal crystals MC may be spaced apart from the first electrode 150 and placed in the first conductive type semiconductor region 170.

In this instance, the length LMC of the plurality of metal crystals MC from the first electrode 150 to the direction of the tunnel layer 160 may be ⅔ or less of the thickness of the first conductive type semiconductor region 170. If the length LMC of the metal crystals MC is limited to ⅔ of the thickness of the first conductive type semiconductor region 170 as described above, damage to the tunnel layer 160 or the semiconductor substrate 100 attributable to the excessive length LMC of the metal crystals MC can be prevented.

Some of the plurality of metal crystals MC may have a reduced width WMC from the first electrode 150 to the direction of the tunnel layer 160. That is, as shown in FIG. 6 or 7, the width WMC in the surface direction (x, y) of a portion that belongs to the metal crystal MC and that neighbors the first electrode 150 may be smaller than the width of a portion that belongs to the metal crystal MC and that is adjacent to the semiconductor substrate 100.

Such a size of the metal crystal MC may be determined in proportion to a firing temperature of the thermal treatment process for forming the first electrode 150.

That is, the length or width of the metal crystal MC is characterized in that it is increased as the firing temperature of thermal treatment process for forming the first electrode 150 rises and it is reduced as the firing temperature of thermal treatment process for forming the first electrode 150 drops. The length or width of the metal crystal MC may be increased as the width of the first electrode 150, that is, the source of the metal crystal MC, is increased.

If the firing temperature of the thermal treatment process for forming the first electrode 150 is excessively low, however, contact resistance between the first electrode 150 and the first conductive type semiconductor region 170 may be increased.

Accordingly, in the second embodiment of the present invention, an example in which all of the first finger electrodes 151 and first bus bar 153 of the first electrode 150 have been depressed into the first conductive type semiconductor region 170 and the metal crystals MC have been formed in both the finger forming region 170A1 and bus bar forming region 170A2 of the first conductive type semiconductor region 170 has been described. In order to further improve efficiency of the solar cell, only the first finger electrodes 151 may be depressed into the first conductive type semiconductor region 170 and the metal crystals MC may be placed only in the finger forming region 170A1, but may not be placed in the bus bar forming region 170A2. This is described in detail below with reference to FIGS. 9 to 11.

Figure 9:
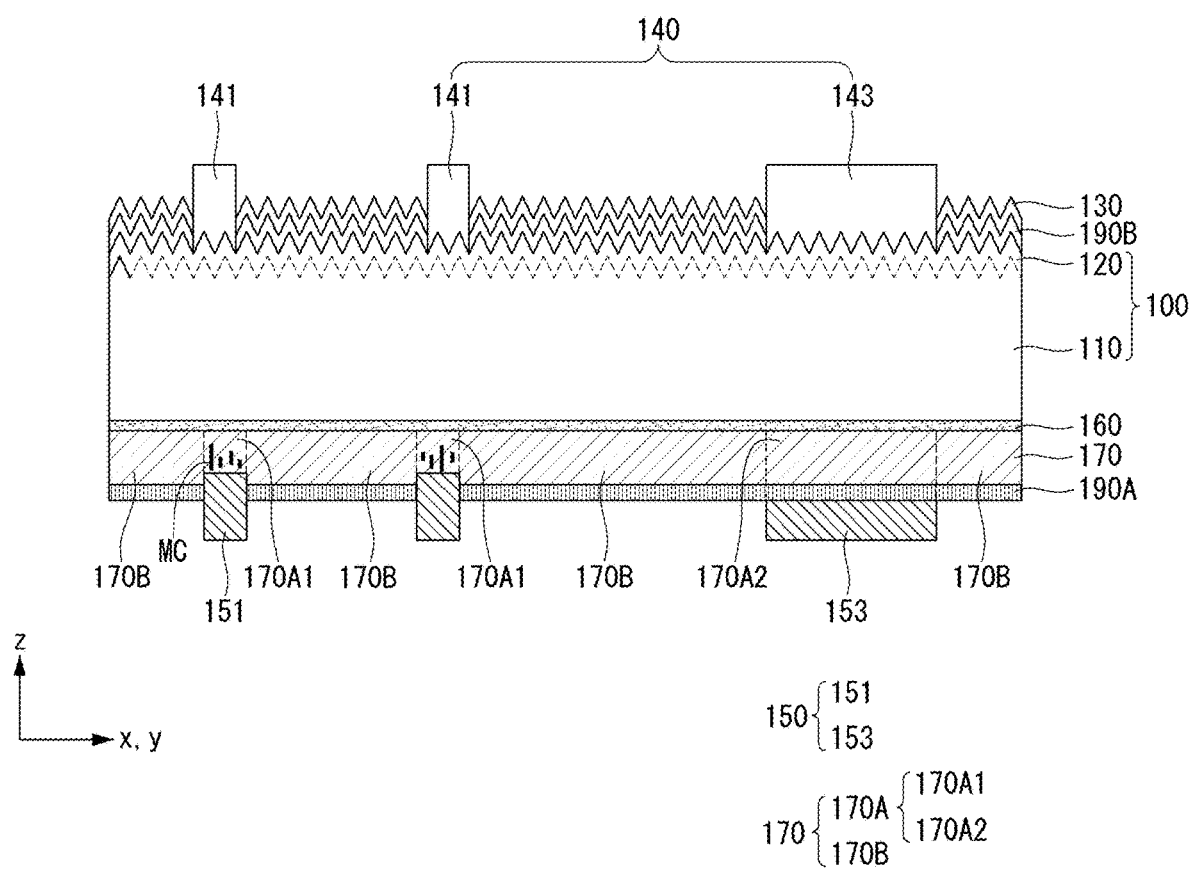
FIG. 9 is a diagram illustrating a solar cell according to a third embodiment of the present invention.

FIG. 9 is a diagram illustrating a solar cell according to a third embodiment of the present invention.

In a description related to FIG. 9, a description of portions redundant with the contents described in connection with the second embodiment is omitted, and portions different from the contents of the second embodiment are chiefly described.

As shown in FIG. 9, in the solar cell according to the third embodiment of the present invention, at least part of the first electrode 150 may be depressed and formed in the first conductive type semiconductor region 170, but only the plurality of first finger electrodes 151 of the first electrode 150 may penetrate the first passivation film 190A and may be depressed and formed in the first conductive type semiconductor region 170.

In this instance, the metal crystals MC may be formed only in the finger forming region 170A1 of the first conductive type semiconductor region 170, and the plurality of first bus bars 153 may not be depressed into the first conductive type semiconductor region 170, but may be formed on the back surface of the first passivation film 190A.

Accordingly, the metal crystals MC may not be formed in the bus bar forming region 170A2 of the first conductive type semiconductor region 170.

As described above, only the plurality of first finger electrodes 151 of the first electrode 150 may penetrate the first passivation film 190A and may be depressed into the first conductive type semiconductor region 170 so that the metal crystals MC are formed only in the finger forming region 170A1 of the first conductive type semiconductor region 170, and the first bus bar 153 may be formed on the first passivation film 190A.

As described above with reference to FIGS. 6 to 8, if the metal crystals MC are not formed in the bus bar forming region 170A2 of the first conductive type semiconductor region 170 as described above, the metal crystals MC are not placed in the tunnel layer 160, and thus there can be prevented the phenomenon in which the semiconductor substrate 100 is deteriorated because the metal crystals MC penetrate the tunnel layer 160 and are connected to the semiconductor substrate 100.

More specifically, the width of the first bus bar 153 is relatively greater than the width of the first finger electrode 151 as described above with reference to FIGS. 1 and 5. Accordingly, in the thermal treatment process, the metal crystals MC having a relatively great length or width may penetrate the tunnel layer 160 and may be short-circuited with the semiconductor substrate 100, as shown in FIG. 8. Accordingly, the semiconductor substrate 100 may be deteriorated. If the metal crystals MC are not formed in the bus bar forming region 170A2 of the first conductive type semiconductor region 170, such a deterioration phenomenon can be prevented.

Accordingly, the solar cell according to the third embodiment of the present invention has a structure in which only the first finger electrodes 151 of the first finger electrodes 151 and first bus bar 153 of the first electrode 150 penetrate the first passivation film 190A and are depressed and formed in the first conductive type semiconductor region 170. Accordingly, only the first conductive type semiconductor region 170 and the first finger electrodes 151 come into contact with each other in the first boundary surface BS1 of the first conductive type semiconductor region 170, the plurality of metal crystals MC may be placed only in the finger forming region 170A1 which belongs to the electrode forming region 170A of the first conductive type semiconductor region 170 and in which the first finger electrode 151 is formed, and the plurality of metal crystals MC may not be placed in the bus bar forming region 170A2 of the first conductive type semiconductor region 170 which overlaps the first bus bar 153.

To this end, in an embodiment of the present invention, the plurality of first finger electrodes 151 and the plurality of first bus bars 153 may have different compositions.

More specifically, content of frit glass per unit volume, which is included in the plurality of first bus bars 153, may be smaller than content of frit glass per unit volume, which is included in the plurality of first finger electrodes 151, or content of frit glass may not be included in the plurality of first bus bars 153.

Accordingly, in the thermal treatment process for forming the first electrode 150, while the plurality of metal crystals MC is extracted into the finger forming region 170A1 when the first finger electrode 151 penetrates the first passivation film 190A and is depressed into the first conductive type semiconductor region 170, the first bus bar 153 can be prevented from penetrating the first passivation film 190A and from being depressed into the first conductive type semiconductor region 170 or such a depression can be minimized.

Moreover, although the first bus bar 153 penetrates the first passivation film 190A and is depressed into the first conductive type semiconductor region 170, the deterioration phenomenon in which the metal crystals MC extracted from the first bus bar 153 penetrate the tunnel layer 160 and are short-circuited with the semiconductor substrate 100 as shown in FIG. 8 can be prevented.

Figure 10:
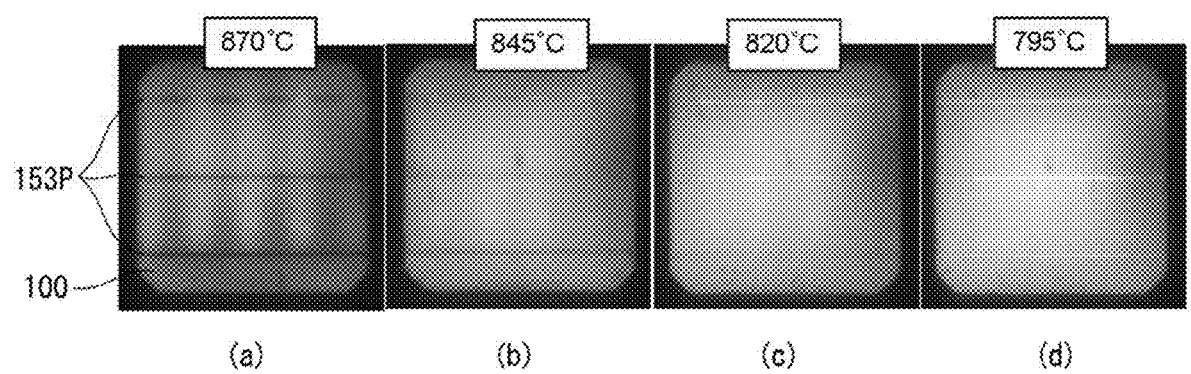
FIG. 10 is a comparison example photograph of the degree of the deterioration of a semiconductor substrate 100 according to firing temperatures in a thermal treatment process, which was taken through photo luminescence (PL), if the material of a paste for first bus bar is the same as the material of a paste for first finger electrodes.
Figure 11:
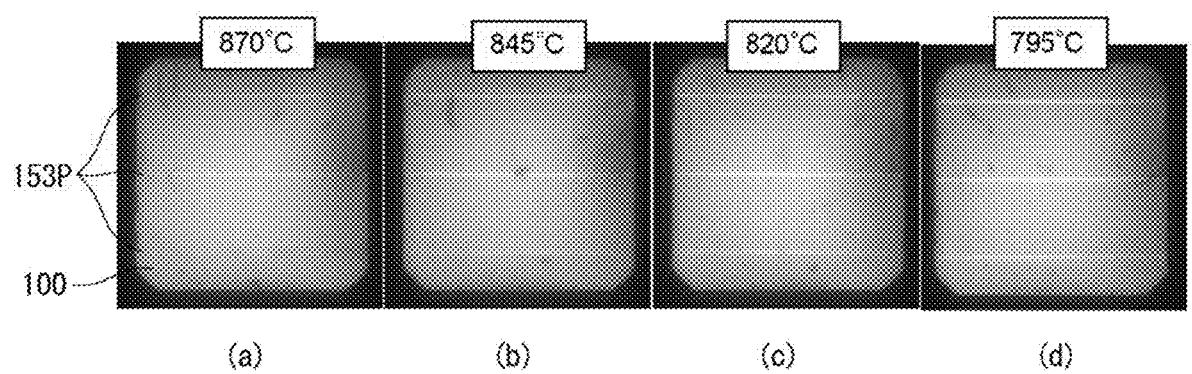
FIG. 11 is photograph of the degree of the deterioration of the semiconductor substrate according to firing temperatures in a thermal treatment process, which was taken through photo luminescence (PL), if the material of the paste for the first bus bar is different from the material of the paste for the first finger electrodes in accordance with the third embodiment of the present invention.

In this instance, the deterioration of the semiconductor substrate 100 may be checked from FIGS. 10 and 11.

FIG. 10 is a comparison example photograph of the degree of the deterioration of the semiconductor substrate 100 according to firing temperatures in the thermal treatment process, which was taken through photo luminescence (PL), if the material of a paste for the first bus bar is the same as the material of a paste for the first finger electrode. FIG. 11 is photograph of the degree of the deterioration of the semiconductor substrate 100 according to firing temperatures in the thermal treatment process, which was taken through photo luminescence (PL), if the material of a paste 153P for the first bus bar is different from the material of a paste for the first finger electrodes in accordance with the third embodiment of the present invention.

From the PL images showing the open voltages Voc of the semiconductor substrate 100, the deterioration phenomenon occurring because the metal crystals MC penetrate the tunnel layer 160 and are short-circuited with the semiconductor substrate 100 depending on the temperature of the thermal treatment process can be checked.

As some region of the semiconductor substrate 100 becomes darker in the PL image, it means the open voltage is reduced and thus the deterioration of the semiconductor substrate 100 is increased. As some region of the semiconductor substrate 100 becomes brighter, it means that the open voltage is sufficiently high and thus the deterioration of the semiconductor substrate 100 is reduced or is not present.

More specifically, if a shade region is increased in the PL image as the temperature of the thermal treatment process rises, it means that the open voltage is reduced and the deterioration of the semiconductor substrate 100 is increased because the metal crystals MC penetrate the tunnel layer 160 and are short-circuited with the semiconductor substrate 100. If a shade region is not increased in the PL image as the temperature of the thermal treatment process rises, it means that the open voltage is sufficiently high and the deterioration of the semiconductor substrate 100 is small or is almost not present because the metal crystals MC do not penetrate the tunnel layer 160 or the semiconductor substrate 100.

In FIGS. 10 and 11, images of the paste 153P for the first bus bar having a relatively great width have been illustrated, but images of a paste for the first finger electrodes having a very small width are not illustrated. The paste for the first finger electrodes may intersect the paste 153P for the first bus bars and may be formed.

FIG. 10 shows an instance where the paste 153P for the first bus bars having the same material as the paste for the first finger electrodes was used, and FIG. 11 shows an instance where the paste 153P for the first bus bars having a material different from the material of the paste for the first finger electrodes as described above with reference to FIG. 9 was used.

In FIG. 10, the paste 153P for the first bus bars and the paste for the first finger electrodes have the same material. Accordingly, the paste 153P for the first bus bars may also penetrate the first passivation film 190A and may be depressed and formed in the first conductive type semiconductor region 170, so the metal crystals MC may be formed in the bus bar forming region 170A2 of the first conductive type semiconductor region 170.

Accordingly, if the temperature of the thermal treatment process for forming the first electrode 150 is relatively low, for example, about 820° C. or 795° C. as shown in (c) and (d) of FIG. 10, the semiconductor substrate 100 is not deteriorated because there is almost no metal crystal MC which is extracted from the paste for the first electrode and subsides into the first conductive type semiconductor region 170. In this instance, efficiency of the solar cell may be reduced because contact resistance of the first finger electrodes 151 may be relatively high.

If the temperature of the thermal treatment process for forming the first electrode 150 is relatively high, for example, about 870° C. or 845° C. as shown in (a) and (b) of FIG. 10, the shade region is increased in the semiconductor substrate 100 and the deterioration of the semiconductor substrate 100 is relatively increased.

The reason for this is that the deterioration of the semiconductor substrate 100 is increased because the metal crystals MC extracted from the paste 153P for the first bus bars are placed in the first conductive type semiconductor region 170 and such metal crystals MC penetrate the tunnel layer 160 and are connected to the semiconductor substrate 100.

As described above with reference to FIG. 9, if the first finger electrodes 151 and the first bus bar 153 are made of different materials in accordance with the third embodiment of the present invention, it may be seen that the shade region of the semiconductor substrate 100 is rarely increased even in (a) and (b) of FIG. 11 in which the temperature of the thermal treatment process is relatively high as well as in (c) and (d) of FIG. 11 in which the temperature of the thermal treatment process is relatively low.

The reason for this is that the semiconductor substrate 100 is not deteriorated because the paste 153P for the first bus bars does not penetrate the first passivation film 190A or although the paste 153P for the first bus bars penetrates the first passivation film 190A and connects to the first conductive type semiconductor region 170 and thus the metal crystals MC are formed in the first conductive type semiconductor region 170, the metal crystals MC are not placed in the tunnel layer 160 if the paste 153P for the first bus bars and the paste for the first finger electrodes are made of different materials.

As described above, the solar cell according to the third embodiment of the present invention can prevent the deterioration of the semiconductor substrate 100 and have further improved efficiency because the solar cell maintains a sufficient high open voltage Voc by forming the first finger electrodes 151 and the first bus bar 153 using different materials.

The structures of the solar cells according to embodiments of the present invention have been described so far. Hereinafter, methods for manufacturing solar cells are described.

Figure 12:
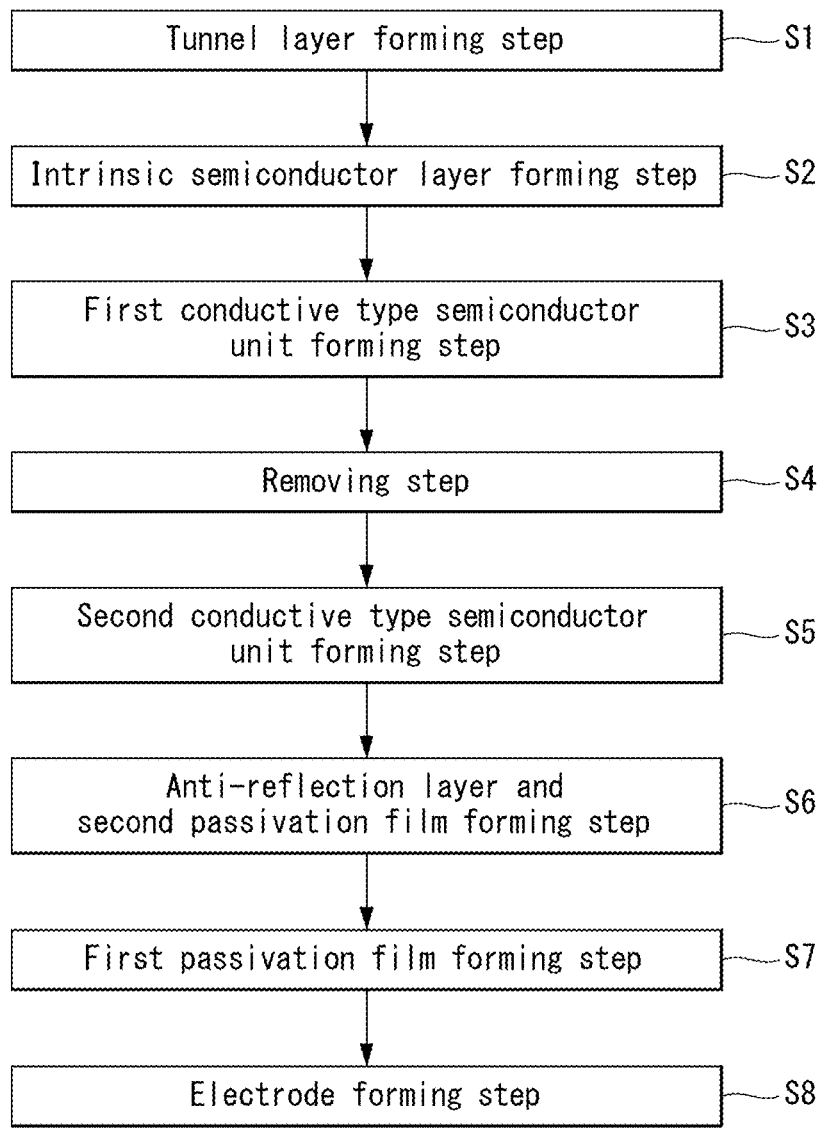
FIG. 12 is a flowchart illustrating an example of a method for manufacturing a solar cell according to a first embodiment of the present invention.

FIG. 12 is a flowchart illustrating an example of a method for manufacturing a solar cell according to a first embodiment of the present invention. FIGS. 13A to 13J are cross-sectional views of the method for manufacturing a solar cell according to the flowchart of FIG. 12.

Figure 14:
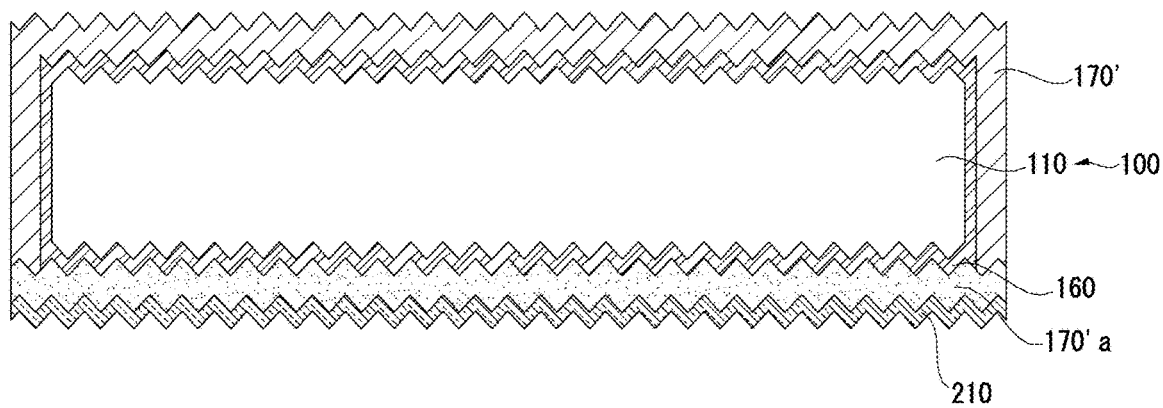
FIG. 14 is a diagram illustrating a modified example of the method for manufacturing a solar cell according to the first embodiment.
Figure 15:
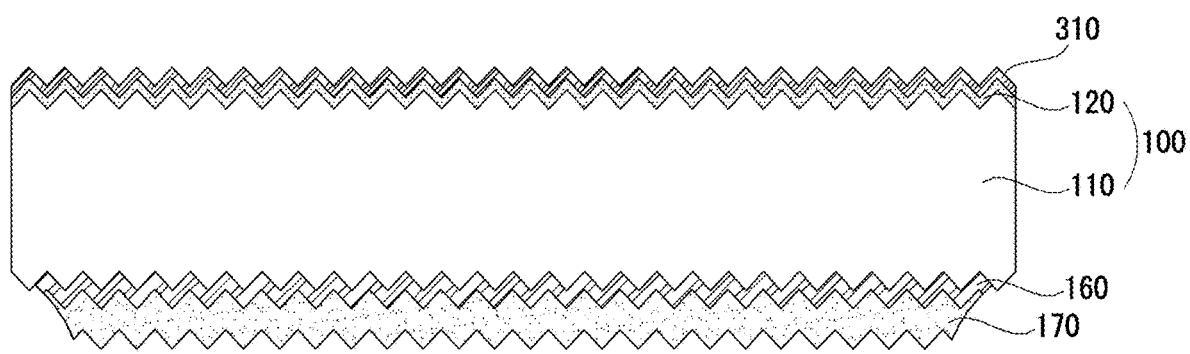
FIG. 15 is a diagram illustrating another modified example of the method for manufacturing a solar cell according to the first embodiment.

Furthermore, FIG. 14 is a diagram illustrating a modified example of the method for manufacturing a solar cell according to the first embodiment. FIG. 15 is a diagram illustrating another modified example of the method for manufacturing a solar cell according to the first embodiment.

As shown in FIG. 12, an example of the method for manufacturing a solar cell according to the first embodiment of the present invention may include a tunnel layer forming step (operation) S1, an intrinsic semiconductor layer forming step (operation) S2, a first conductive type semiconductor region forming step (operation) S3, a removing step (operation) S4, a second conductive type semiconductor region forming step (operation) S5, an anti-reflection layer and second passivation film forming step (operation) S6, a first passivation film forming step (operation) S7, and an electrode forming step (operation) S8.

In this example, the removing step S4 and the anti-reflection layer and second passivation film forming step S6 have been illustrated as being included. In some embodiments, the removing step S4 and the anti-reflection layer and second passivation film forming step S6 may be omitted.

An example in which the removing step S4 and the anti-reflection layer and second passivation film forming step S6 are included, for convenience of description, is described below.

Figure 13A:
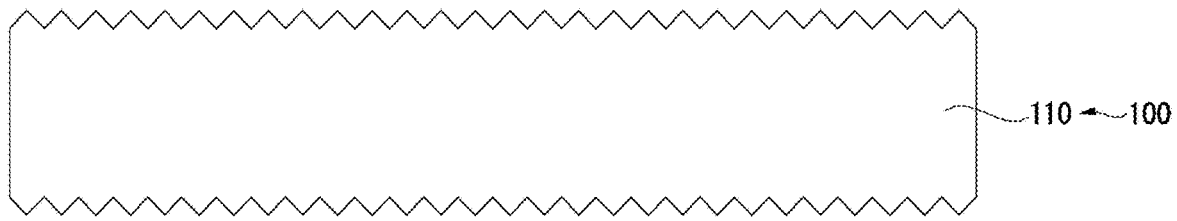
FIGS. 13A to 13J are cross-sectional views of the method for manufacturing a solar cell according to the flowchart of FIG. 12.

As a preliminary step (operation) for manufacturing a solar cell according to the first embodiment of the present invention, the concave-convex portions may be formed by performing a texturing process on the front and back surfaces of the semiconductor substrate 100, as shown in FIG. 13A.

Wet or dry texturing may be used as the texturing technique for the semiconductor substrate 100.

The wet texturing may be performed by dipping the semiconductor substrate 100 into a texturing solution and is advantageous in that the process time is short. The dry texturing may be performed by cutting a surface of the semiconductor substrate 100 using a diamond grill or a laser. In the dry texturing, the concave-convex portions may be uniformly formed, but the process time is long and the semiconductor substrate 100 may be damaged.

In addition, the semiconductor substrate 100 may be textured using reactive ion etch (RIE). As described above, in an embodiment of the present invention, the semiconductor substrate 100 may be textured using various methods.

For a simple illustration, concave-convex portions have been illustrated as being not formed on the side of the semiconductor substrate 100 by the texturing. Furthermore, it may be difficult to clearly recognize the concave-convex portions by the texturing because the semiconductor substrate 100 has a very small thickness.

However, the present invention is not limited to the above description. For example, the concave-convex portions according to the texturing may be provided on the side of the semiconductor substrate 100. Furthermore, the texturing of the semiconductor substrate 100 may be performed in a subsequent process.

As shown in FIG. 12, the tunnel layer forming step S1 for forming the tunnel layer 160 on one surface of the semiconductor substrate 100 may be performed in the state in which the concave-convex portions have been provided in the semiconductor substrate 100 as described above.

Figure 13B:
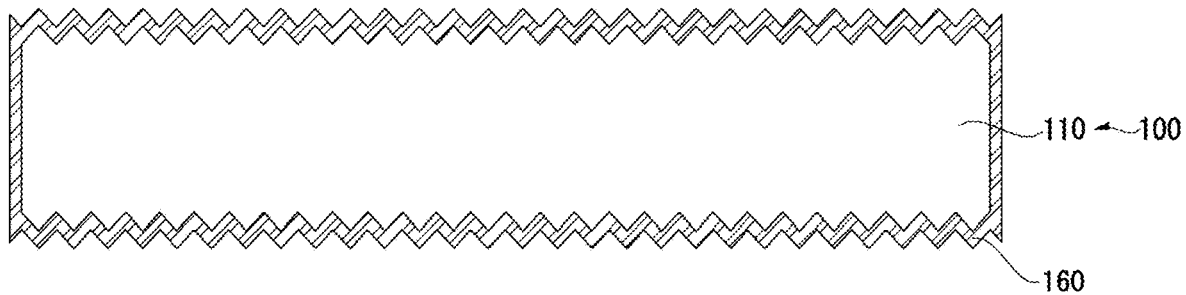

In the tunnel layer forming step S1, for example, as shown in FIG. 13B, the tunnel layer 160 may be generally formed on one surface and the other surface of the semiconductor substrate 100. In this instance, the tunnel layer 160 may also be generally formed on the side of the semiconductor substrate 100.

If the tunnel layer 160 is generally formed on the surfaces of the semiconductor substrate 100 as described above, the tunnel layer 160 formed on the other surface (i.e., the front surface) and side of the semiconductor substrate 100 may be removed in the removing step S4.

If the tunnel layer 160 is formed on only one surface of the semiconductor substrate 100, the removing step S4 may be omitted.

In this instance, the tunnel layer 160 may be formed by thermal oxidation, chemical oxidation, or deposition (e.g., an atmospheric pressure chemical vapor deposition (APCVD) method or a low-pressure chemical vapor deposition (LPCVD) method), for example. Additionally, after the tunnel layer 160 having a thin thickness is formed, the thickness or density of the tunnel layer 160 may be increased by subsequent thermal treatment within a furnace.

However, the present invention is not limited to such methods. The tunnel layer 160 may be formed by various other methods. In this instance, the tunnel layer 160 may be formed of a silicon oxide layer.

For example, in the present embodiment, the tunnel layer 160 may be formed in a gas atmosphere, including a source gas, at a temperature higher than normal temperature and pressure smaller than atmospheric pressure. In the present embodiment, the source gas includes an oxygen gas, and thus the tunnel layer 160 may be formed of an oxide layer.

More specifically, at a high temperature, the tunnel layer 160 may be formed of a thermal oxide (e.g., thermal silicon oxide) layer formed by a reaction of oxygen and the semiconductor material (e.g., silicon) of the semiconductor substrate 100.

In the present embodiment, the source gas does not include all source materials forming the tunnel layer 160, but may include only an oxygen gas of the oxide forming the tunnel layer 160 and may not include other source materials.

For example, if the tunnel layer 160 includes silicon oxide, it includes only an oxygen gas as the source gas, but does not include a gas including silicon, that is, other source material. Accordingly, the tunnel layer 160 may be formed by a thermal oxidation process in which oxygen included in the oxygen gas is diffused into the semiconductor substrate 100 and reacts with the semiconductor material.

In some embodiments, in a deposition process, a silane ($SiH_4$) gas including silicon, together with an oxygen gas including oxygen, may be supplied as the source gas. In this instance, oxygen separated from the oxygen gas may chemically react with silicon separated from the silane gas by thermal decomposition, thereby being capable of forming silicon oxide. When the tunnel layer 160 is formed, a gas atmosphere may include various gases in addition to the oxygen gas, that is, the source gas.

Furthermore, pressure when the tunnel layer 160 is formed may be lower than atmospheric pressure. In this instance, although the tunnel layer 160 is formed by a thermal oxidation process using a relatively high temperature (e.g., 600° C. or more), the tunnel layer 160 can maintain low growth speed due to the low pressure. Accordingly, the thickness of the tunnel layer 160 can be significantly reduced.

For example, when the tunnel layer 160 is formed, a temperature may be set to 600° C. to 800° C. and pressure may be set to 600 Torr or less in order to effectively control the thickness of the tunnel layer 160.

As described above, in the present embodiment, when the tunnel layer 160 is formed, both the temperature and pressure need to be controlled. Accordingly, the tunnel layer 160 according to the present embodiment may not be formed in a conventional furnace whose pressure cannot be controlled, and the tunnel layer 160 has to be formed in an apparatus whose temperature and pressure can be controlled.

Accordingly, in the present embodiment, the tunnel layer 160 may be formed by a thermal oxidation process within deposition apparatus. In this instance, since low pressure needs to be implemented, the tunnel layer 160 may be formed in a low-pressure chemical vapor deposition apparatus.

An intrinsic semiconductor layer 170' formed on the tunnel layer 160 is formed by a deposition apparatus. Accordingly, if the tunnel layer 160 is formed in the deposition apparatus, the tunnel layer 160 and the intrinsic semiconductor layer 170' can be formed by an in-situ process for consecutively forming the tunnel layer 160 and the intrinsic semiconductor layer 170' in the same deposition apparatus (more specifically, a low-pressure chemical vapor deposition apparatus).

If the tunnel layer 160 and the intrinsic semiconductor layer 170' are formed by an in-situ process as described above, a manufacturing cost and a manufacturing time can be significantly reduced because the manufacturing process is significantly simplified.

A temperature within the deposition apparatus is controlled by applying heat (e.g., heating) or removing heat (e.g., cooling) for a long time, and a lot of time is taken to stabilize the temperature. In contrast, a gas atmosphere and pressure may be controlled by the type and amount of gas supplied to the deposition apparatus. Accordingly, a gas atmosphere and pressure can be more easily controlled than a temperature.

In the present embodiment, a difference between a temperature at which the tunnel layer 160 is formed and a temperature in the process of depositing the intrinsic semiconductor layer 170' may be set to 200° C. or less (i.e., 0° C. to 200° C.). More specifically, a difference between a temperature at which the tunnel layer 160 is formed and a temperature in the process of depositing the intrinsic semiconductor layer 170' may be set to 100° C. or less (i.e., 0° C. to 100° C.).

The reason for this is that a difference between a temperature at which the tunnel layer 160 is formed and a temperature in the process of depositing the intrinsic semiconductor layer 170' can be reduced because the tunnel layer 160 is formed at low pressure and thus the temperature at which the tunnel layer 160 is formed can be relatively raised. Accordingly, efficiency of the in-situ process of consecutively forming the tunnel layer 160 and the intrinsic semiconductor layer 170' can be further improved because a temperature that is relatively difficult to control can be maintained without a great change or variance as described above.

In contrast, a gas atmosphere in the process of depositing the intrinsic semiconductor layer 170' may be different from a gas atmosphere when the tunnel layer 160 is formed, and pressure in the process of depositing the intrinsic semiconductor layer 170' may be the same as or different from pressure when the tunnel layer 160 is formed. This is described in more detail later in a subsequent description of the deposition process of the intrinsic semiconductor layer 170'.

After the tunnel layer forming step S1 is completed as described above, the intrinsic semiconductor layer forming step S2 for forming the intrinsic semiconductor layer 170' on the tunnel layer 160 formed on one surface of the semiconductor substrate 100 may be performed as shown in FIG. 12.

Figure 13C:
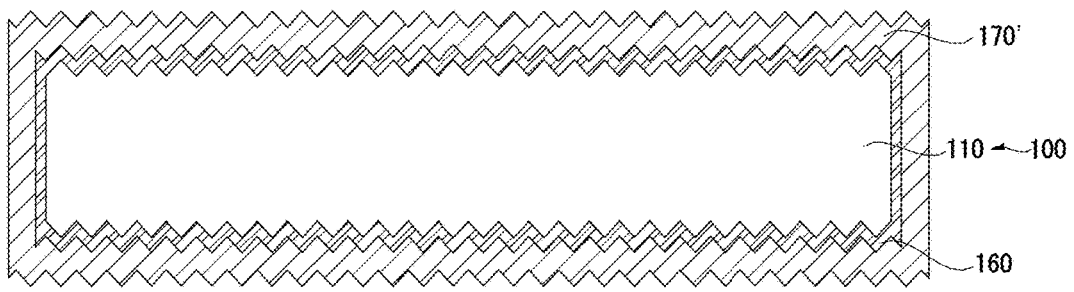

For example, as shown in FIG. 13C, in the intrinsic semiconductor layer forming step S2, the intrinsic semiconductor layer 170' may be generally formed on the tunnel layer 160 formed on one surface and the other surface of the semiconductor substrate 100. In this instance, the intrinsic semiconductor layer 170' may also be generally formed on the tunnel layer 160 placed on the side of the semiconductor substrate 100.

If the intrinsic semiconductor layer 170' is placed on both sides of the semiconductor substrate 100 as described above, the doping and damage of the front surface of the semiconductor substrate 100 can be effectively prevented in the process of doping the intrinsic semiconductor layer 170' in order to form the first conductive type semiconductor region 170.

In the present embodiment, the intrinsic semiconductor layer 170' may be formed by chemical vapor deposition. More specifically, the intrinsic semiconductor layer 170' may be formed by low-pressure chemical vapor deposition.

Accordingly, the intrinsic semiconductor layer 170' may be formed by the tunnel layer 160 and the in-situ process as described above, but the present invention is not limited thereto. The in-situ process may not be applied to the tunnel layer 160 and the intrinsic semiconductor layer 170'.

A gas used in the process of depositing the intrinsic semiconductor layer 170' may include a gas (e.g., a silane gas) including a semiconductor material which forms the intrinsic semiconductor layer 170'. In the present embodiment, since the intrinsic semiconductor layer 170' is deposited so that the gas atmosphere has the intrinsic property, the gas atmosphere may include only the gas including the semiconductor material.

Accordingly, a supply gas can be simplified, and the purity of the formed intrinsic semiconductor layer 170' can be improved, but the present invention is not limited thereto. A separate gas for accelerating the deposition process of the intrinsic semiconductor layer 170' or improving the characteristics of the intrinsic semiconductor layer 170' may be further used.

Furthermore, in the deposition process of the intrinsic semiconductor layer 170', the size of a crystal grain and crystallizability may be controlled by injecting the gas, including the semiconductor material, along with a nitrogen oxide ($N_2O$) gas and/or an oxygen ($O_2$) gas.

The deposition temperature of the intrinsic semiconductor layer 170' may be the same as or lower than a temperature when the tunnel layer 160 is formed. In particular, if the deposition temperature of the intrinsic semiconductor layer 170' is lower than a temperature when the tunnel layer 160 is formed, a characteristic of the intrinsic semiconductor layer 170' which directly takes part in photoelectric conversion can become uniform.

In some embodiments, the deposition temperature of the intrinsic semiconductor layer 170' may be 500° C. to 700° C. Such a deposition temperature is suitable for depositing the intrinsic semiconductor layer 170' having a crystal structure different from that of the semiconductor substrate 100.

The temperature of the tunnel layer 160 is set to be the same as or similar to the deposition temperature of the intrinsic semiconductor layer 170' as described above. Accordingly, the process can be simplified because the time taken to control a temperature and the time taken to stabilize a temperature are not required.

Furthermore, deposition pressure of the intrinsic semiconductor layer 170' may be lower than atmospheric pressure, for example, 600 Torr or less (e.g., 1 Torr to 600 Torr). To maintain the deposition pressure less than 1 Torr may be limited on the nature of the process, and the deposition pressure of less than 1 Torr may be difficult to apply to actual mass production because the process time of the intrinsic semiconductor layer 170' is greatly increased.

If the deposition pressure exceeds 600 Torr, the uniformity of the intrinsic semiconductor layer 170' may be deteriorated. In some embodiments, the deposition pressure of the intrinsic semiconductor layer 170' may be the same as or smaller than pressure when the tunnel layer 160 is formed.

In particular, if the deposition pressure of the intrinsic semiconductor layer 170' is smaller than pressure when the tunnel layer 160 is formed, a characteristic of the intrinsic semiconductor layer 170' which directly takes part in photoelectric conversion can become uniform.

This is described in more detail. A gas including a semiconductor material (e.g., silicon) is thermally decomposed and the semiconductor material is deposited on the tunnel layer 160, thereby being capable of forming the intrinsic semiconductor layer 170'.

If a temperature and/or pressure of the intrinsic semiconductor layer 170' are increased in order to increase deposition speed, the distribution of crystallizability within the intrinsic semiconductor layer 170' is increased. If the distribution of crystallizability within the intrinsic semiconductor layer 170' is increased, the characteristics of the intrinsic semiconductor layer 170' may not become uniform because the crystallizability of the intrinsic semiconductor layer 170' takes part in moving speed of carriers.

In contrast, the tunnel layer 160 is formed in a very thin thickness, and the crystallizability of the tunnel layer 160 does not have an influence on the characteristics of the tunnel layer 160. Although the intrinsic semiconductor layer 170' needs to be formed in a thicker thickness than the tunnel layer 160, the deposition temperature and/or pressure of the intrinsic semiconductor layer 170' are set to be smaller than those when the tunnel layer 160 is formed in order to improve the characteristics of the intrinsic semiconductor layer 170'.

However, the present invention is not limited to such an example. A gas atmosphere, temperature, and pressure of the intrinsic semiconductor layer 170' may be changed in various ways.

As described above, the intrinsic semiconductor layer 170' may be formed by changing the type of gas supplied after the tunnel layer 160 is formed and controlling the amount of a supplied gas.

For example, the intrinsic semiconductor layer 170' may be formed by removing a gas (e.g., an oxygen gas, a nitrogen gas, or a chlorine gas), used when the tunnel layer 160 is formed after the tunnel layer 160 is formed, by pumping and purging, and then injecting a gas (e.g., a gas including a semiconductor material) for forming the intrinsic semiconductor layer 170'.

Accordingly, the process of forming the tunnel layer 160 and the intrinsic semiconductor layer 170' can be simplified. Furthermore, if the semiconductor substrate 100 on which the tunnel layer 160 has been formed is taken out from an apparatus after the tunnel layer 160 is formed as in a prior art, there is a problem in that the tunnel layer 160 is contaminated by impurities or the thickness of the tunnel layer 160 is increased due to an additional oxidation.

In the present embodiment, the tunnel layer 160 is not externally exposed until the intrinsic semiconductor layer 170' is formed because the intrinsic semiconductor layer 170' is consecutively formed in an apparatus in which the tunnel layer 160 has been formed. Accordingly, a problem occurring because the tunnel layer 160 is externally exposed before the intrinsic semiconductor layer 170' is formed can be prevented.

For reference, if plasma-enhanced chemical vapor deposition (PECVD) is used, a separate crystallization annealing process needs to be performed so that the intrinsic semiconductor layer 170' has a polycrystalline structure after it is formed. Accordingly, the structure becomes complicated, and performance may be deteriorated. Furthermore, since PECVD is a one-sided process, it may be difficult to generally form the intrinsic semiconductor layer 170' on both sides of the semiconductor substrate 100.

Thereafter, as shown in FIG. 12, the first conductive type semiconductor region forming step S3 may be performed.

In the first conductive type semiconductor region forming step S3, the first conductive type semiconductor region 170 may be formed by doping impurities of the first conductive type into the intrinsic semiconductor layer 170' formed on one surface of the semiconductor substrate 100.

Figure 13D:
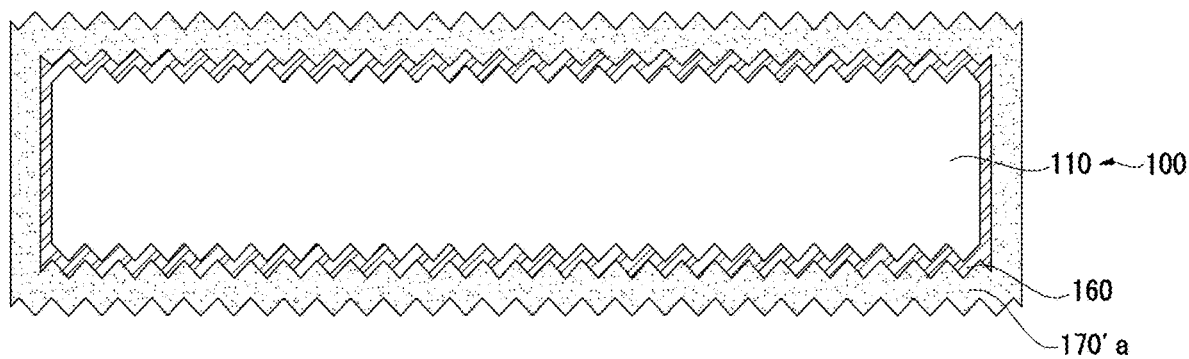

More specifically, in the first conductive type semiconductor region forming step S3, as shown in FIG. 13D, a first conductive type semiconductor region 170'a may be formed on the entire surface of the semiconductor substrate 100 by doping impurities of the first conductive type into the intrinsic semiconductor layer 170' formed on the entire surface of the semiconductor substrate 100.

In this instance, in the present embodiment, the impurities of the first conductive type may be doped using a thermal diffusion method. The reason for this is that the thermal diffusion method is capable of doping while minimizing the deterioration of the characteristics of the tunnel layer 160. In contrast, if an ion implantation method is used, the characteristics of the tunnel layer 160 may be deteriorated due to activation thermal treatment performed at high temperature after ion implantation.

For example, as shown in FIG. 13D, the first conductive type semiconductor region 170'a may be generally formed by thermal treatment in a gas atmosphere including the impurities of the first conductive type.

If the first conductive type semiconductor region 170'a has an n type, thermal treatment may be performed in a gas atmosphere including $POCl_3$. If the first conductive type semiconductor region 170'a has a p type, thermal treatment may be performed in a gas atmosphere including $BBr_3$.

The process of forming the first conductive type semiconductor region 170'a can be simplified using a gas including the impurities of the first conductive type as described above. In this instance, doping may be performed on the front surface and side of the semiconductor substrate 100 in addition to the back surface of the semiconductor substrate 100 due to such a process.

In the present embodiment, since portions of the intrinsic semiconductor layer 170' to be removed in a subsequent process are present on the front surface and side of the semiconductor substrate 100, a problem in that the front surface and side of the semiconductor substrate 100 are unnecessarily doped with the impurities of the first conductive type can be fundamentally prevented.

In an alternative embodiment, that is, a modified example, as shown in FIG. 14, the first conductive type semiconductor region 170'a may be formed by forming a first doping layer 210, including impurities of the first conductive type, on the intrinsic semiconductor layer 170' placed at least on the back surface side of the semiconductor substrate 100 and diffusing the impurities of the first conductive type included in the first doping layer 210 through thermal treatment.

For example, the first doping layer 210 may include phosphorous silicate glass (PSG) or boron silicate glass (BSG). The first doping layer 210 may be easily formed by deposition.

For example, the first doping layer 210 may be formed by atmospheric pressure chemical vapor deposition and may be formed on the back surface and/or side of the semiconductor substrate 100, but may not be formed on the front surface of the semiconductor substrate 100. Accordingly, the first conductive type semiconductor region 170'a may be formed on only the back surface and/or side of the semiconductor substrate 100, and the intrinsic semiconductor layer 170' may remain intact on the front surface of the semiconductor substrate 100.

Figure 13E:
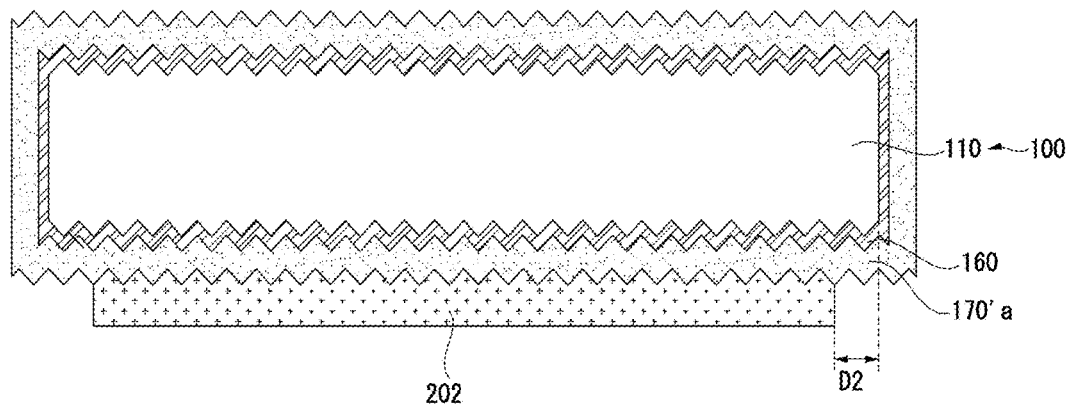

Next, as shown in FIG. 13E, a mask layer 202 may be formed on the first conductive type semiconductor region 170'a placed on the back surface side of the semiconductor substrate 100 so that the mask layer 202 corresponds to the first conductive type semiconductor region (170 in FIG. 13F) to be left other than the isolation portion (I in FIG. 13F, hereinafter the same).

More specifically, the area of the mask layer 202 may be smaller than that of the semiconductor substrate 100. Accordingly, the first conductive type semiconductor region (170 in FIG. 13F) that remains other than the isolation portion I may have a smaller area than the semiconductor substrate 100 by removing an unwanted portion of the first conductive type semiconductor region 170'a.

For example, the mask layer 202 may be spaced apart from each side (or the edge) of the semiconductor substrate 100 at a specific second distance D2. If the area of the mask layer 202 is the same as or greater than the area of the semiconductor substrate 100, it may be difficult to effectively remove the unwanted portion of the first conductive type semiconductor region 170'a which is adjacent to the side of the semiconductor substrate 100 on the back surface side of the semiconductor substrate 100.

The second distance D2 may be controlled so that the first distance D1 between the first conductive type semiconductor region 170'a and the edge of the back surface of the semiconductor substrate 100 has a required value. For example, the second distance D2 may have a value of 1 mm or less (e.g., 1 nm to 1 mm) so that the first distance D1 has a value of 1 mm or less (e.g., 1 nm to 1 mm), but the present invention is not limited thereto. The second distance D2 may have values other than 1 mm or less.

The mask layer 202 may include a material which is not removed in the process of removing part (i.e., the edge D2 of the other surface, side, or one surface of the semiconductor substrate 100) of the first conductive type semiconductor region 170'a including the semiconductor material.

For example, the mask layer 202 not etched by an etch solution which is used in the process of removing part of the first conductive type semiconductor region 170'a may include oxide, nitride, or resin. For example, the mask layer 202 may be formed of a silicon nitride layer so that the mask layer 202 is formed by a simple process.

As shown in FIG. 12, the removing step S4 may be performed prior to the second conductive type semiconductor region forming step S5 after the first conductive type semiconductor region forming step S3.

In the removing step S4, for example, the tunnel layer 160 and the intrinsic semiconductor layer 170' or the first conductive type semiconductor region 170'a placed on the other surface of the semiconductor substrate 100 in FIG. 13E may be removed.

Furthermore, in the removing step S4, portions of the first conductive type semiconductor region 170'a and the tunnel layer 160 not covered by the mask layer 202 in FIG. 13E may be removed, so the isolation portion I may be formed.

Figure 13F:
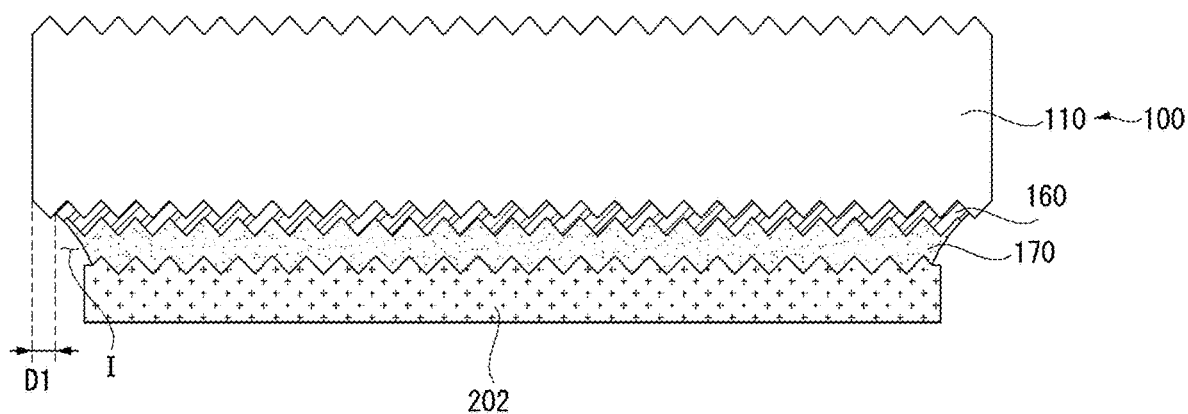

The tunnel layer 160 and the first conductive type semiconductor region 170'a are moved as described above, so the tunnel layer 160 and the first conductive type semiconductor region 170, such as those shown in FIG. 13F, may be formed.

In the removing step S4, wet etch using an alkali solution (e.g., a KOH solution), for example, may be performed on the first conductive type semiconductor region 170'a and the tunnel layer 160.

In accordance with such wet etch, the first conductive type semiconductor region 170'a and the tunnel layer 160 placed in the isolation portion I on the front surface, side, or back surface of the semiconductor substrate 100 can be removed by a simple and easy process.

The first conductive type semiconductor region 170'a may be removed selectively and easily using the alkali solution. The tunnel layer 160 having a very small thickness, albeit being an oxide, may also be removed when the first conductive type semiconductor region 170'a is removed.

Accordingly, as shown in FIG. 13F, the first conductive type semiconductor region 170 and the tunnel layer 160 each formed to have a smaller area than the semiconductor substrate 100 and spaced apart from the edge of the back surface of the semiconductor substrate 100 at the first distance D1 may be formed.

The first conductive type semiconductor region 170 and the tunnel layer 160 may have a shape having an area reduced as they become distant from the semiconductor substrate 100 and the sides thereof may be formed to be rounded by the wet etch.

However, the present invention is not limited to the above description. Part of the first conductive type semiconductor region 170 and the tunnel layer 160 may be removed by various methods, such as RIE and dry etch, and the first conductive type semiconductor region 170 and the tunnel layer 160 may have a different shape.

The mask layer 202 may be removed after part of the first conductive type semiconductor region 170 and the tunnel layer 160 is removed so that the isolation portion I is formed. The mask layer 202 may be removed by various methods depending on a material.

For example, if the mask layer 202 includes an oxide or a nitride, it may be removed by a process using diluted hydrofluoric acid. The mask layer 202 may be removed by a separate process or may be naturally removed by a cleaning process including a solution including diluted hydrofluoric acid.

After the removing step S4 is performed as described above, as shown in FIG. 12, the second conductive type semiconductor region forming step S5 for forming the second conductive type semiconductor region 120 by doping impurities of the second conductive type on the other surface of the semiconductor substrate 100 may be performed.

Figure 13G:
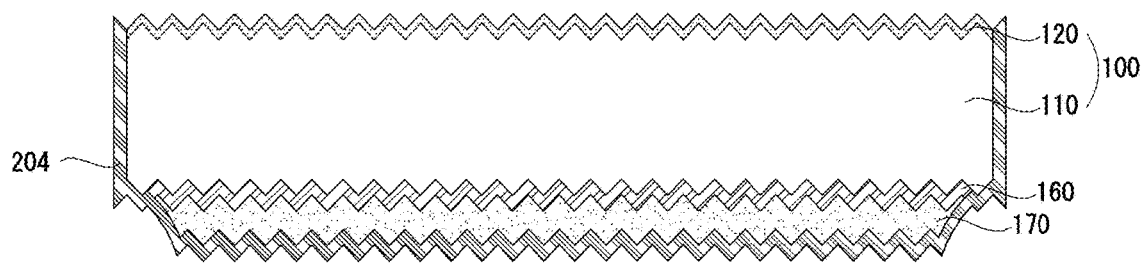

More specifically, as shown in FIG. 13G, in the second conductive type semiconductor region forming step S5, the second conductive type semiconductor region 120 may be formed by doping impurities of the second conductive type on the front surface side of the semiconductor substrate 100.

The second conductive type semiconductor region 120 may be formed by known various methods. For example, the second conductive type semiconductor region 120 may be formed by a thermal diffusion method. The reason for this is that the thermal diffusion method is capable of doping while minimizing the deterioration of the characteristics of the tunnel layer 160. In contrast, if an ion implantation method is used, the characteristics of the tunnel layer 160 may be deteriorated due to activation thermal treatment performed at high temperature after ion implantation.

If the thermal diffusion method is used, in the second conductive type semiconductor region forming step S5, as shown in FIG. 13G, the second conductive type semiconductor region 120 may be formed on the front surface of the semiconductor substrate 100 by forming a capping film 204 on the side and back surface of the semiconductor substrate 100 and performing thermal treatment in a gas atmosphere including impurities of the second conductive type.

If the second conductive type semiconductor region 120 has a p type, the thermal treatment may be performed in a gas atmosphere including $BBr_3$. If the second conductive type semiconductor region 120 has an n type, the thermal treatment may be performed in a gas atmosphere including $POCl_3$. After the second conductive type semiconductor region 120 is formed through such thermal treatment, the capping film 204 may be removed. Various films capable of preventing the doping of the impurities of the second conductive type may be used as the capping film 204. The capping film 204 may be removed by a removing method depending on a material.

In the second conductive type semiconductor region forming step S5, for another example, as shown in FIG. 15, the second conductive type semiconductor region 120 may be formed by forming a second doping layer 310, including impurities of the second conductive type, on the front surface of the semiconductor substrate 100 and diffusing the impurities of the second conductive type, included in the second doping layer 310, into the semiconductor substrate 100 through thermal treatment.

The second doping layer 310 may include boron silicate glass (BSG) or phosphorous silicate glass (PSG). The second doping layer 310 may be easily formed by deposition. In this instance, the second doping layer 310 may be formed by atmospheric pressure chemical vapor deposition and may not be formed on the back surface of the semiconductor substrate 100.

Thereafter, as shown in FIG. 12, the anti-reflection layer and second passivation film forming step S6 may be performed.

In the anti-reflection layer and second passivation film forming step S6, the second passivation film 190B and the anti-reflection layer 130 may be sequentially formed on the second conductive type semiconductor region 120.

Figure 13H:
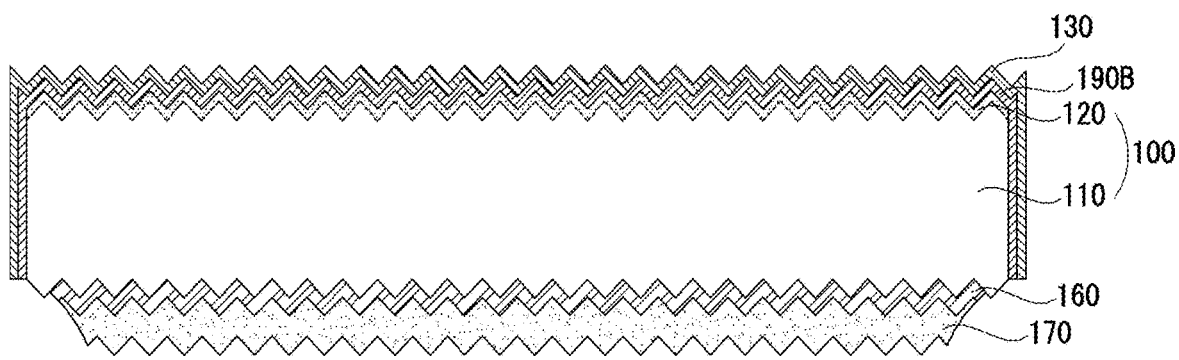

In the anti-reflection layer and second passivation film forming step S6, for example, as shown in FIG. 13H, the second passivation film 190B and the anti-reflection layer 130 may be sequentially formed on the side of the semiconductor substrate 100 in addition to the front surface of the second conductive type semiconductor region 120.

The second passivation film 190B or the anti-reflection layer 130 may be formed by various methods, such as a vacuum deposition method, a chemical vapor deposition method, spin coating, screen printing, or spray coating.

If one-sided deposition, such as plasma-enhanced chemical vapor deposition (PECVD), is used when the second passivation film 190B or the anti-reflection layer 130 is formed, the second passivation film 190B or the anti-reflection layer 130 may be formed on only the front surface and/or side of the semiconductor substrate 100. Accordingly, a separate patterning process for the second passivation film 190B or the anti-reflection layer 130 is not required.

Thereafter, as shown in FIG. 12, the first passivation film forming step S7 for forming the first passivation film 190A on the first conductive type semiconductor region 170 may be performed.

Figure 13I:
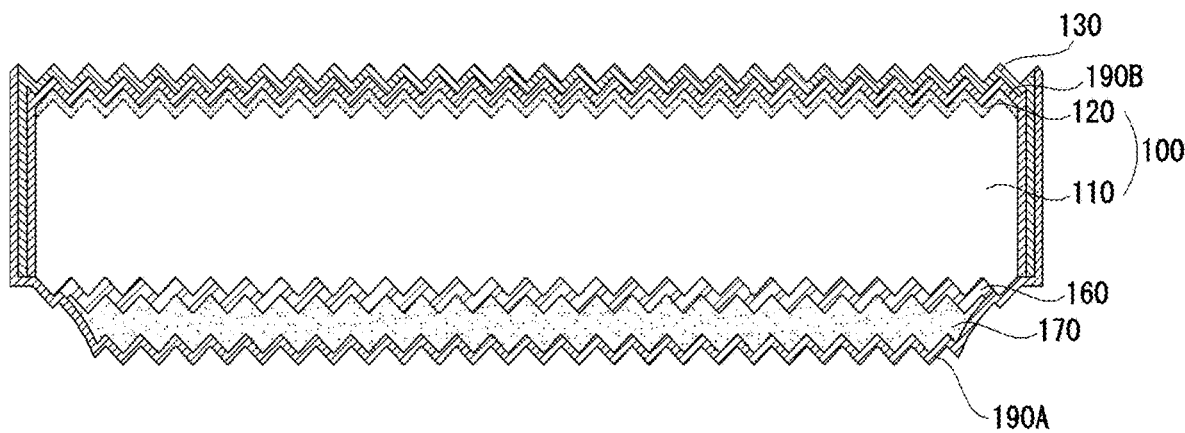
Figure 13J:
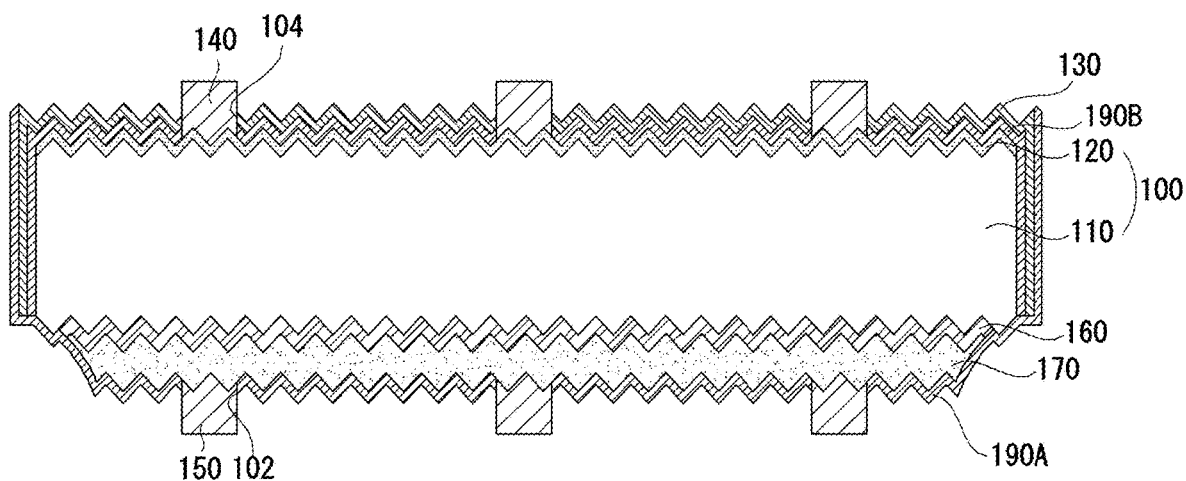

For example, as shown in FIG. 13I, the first passivation film 190A may be formed on the first conductive type semiconductor region 170 placed on the back surface side of the semiconductor substrate 100, the isolation portion I placed in the edge of the back surface of the semiconductor substrate 100, and the second passivation film 190B and the anti-reflection layer 130 placed on the side of the semiconductor substrate 100.

Accordingly, after edge isolation according to the isolation portion I is performed, the isolation portion I may also be passivated while the first passivation film 190A is formed without a separate process.

The first passivation film 190A may be formed by various methods, such as a vacuum deposition method, a chemical vapor deposition method, spin coating, screen printing, or spray coating.

If one-sided deposition, such as plasma-enhanced chemical vapor deposition (PECVD), is used when the first passivation film 190A or the anti-reflection layer 130 is formed, the first passivation film 190A may be formed on only the back surface and/or side of the semiconductor substrate 100. Accordingly, a separate patterning process for the first passivation film 190A is not required.

In the present embodiment, an example in which the second passivation film 190B covering the front surface side of the semiconductor substrate 100 is first formed and the first passivation film 190A covering the back surface side of the semiconductor substrate 100 is then formed has been described.

In this instance, the characteristics of the first conductive type semiconductor region 170 can be prevented from being deteriorated or damaged in the process of forming the first passivation film 190A. The reason for this is that the characteristics of the first conductive type semiconductor region 170 may be very important, in particular, if the first conductive type semiconductor region 170 is an emitter region.

However, the present invention is not limited to the example. For example, after the first passivation film 190A covering the back surface side of the semiconductor substrate 100 is formed, the second passivation film 190B covering the front surface side of the semiconductor substrate 100 may be formed.

In this instance, the first passivation film 190A covering the back surface side of the semiconductor substrate 100 may be placed on (e.g., brought into contact with) the side of the semiconductor substrate 100, and the second passivation film 190B covering the front surface side of the semiconductor substrate 100 may be placed on (e.g., brought into contact with) on the first passivation film 190A.

After the first passivation film 190A is formed as described above, as shown in FIGS. 12 and 13J, the electrode forming step S8 for forming the first electrode 150 connected to the first conductive type semiconductor region 170 and the second electrode 140 connected to the second conductive type semiconductor region 120 may be performed.

The electrode forming step S8 may include the step (operation) of forming the opening portion 102 in the first passivation film 190A. Accordingly, in the electrode forming step S8, the first and the second opening portions 102 and 104 may be formed in the first and the second passivation films 190A and 190B by a patterning process, for example. Next, the first and the second electrodes 150 and 140 may be formed while the first and the second opening portions 102 and 104 are filled with metal for forming the first and the second electrodes 150 and 140.

In this instance, the first and the second opening portions 102 and 104 may be formed by laser ablation using a laser or various methods using an etch solution, an etch paste, and a photo process. Furthermore, the first and the second electrodes 150 and 140 may be formed by various methods, such as a plating method or a deposition method.

Accordingly, the isolation portion I can be formed by a simple process, and a problem attributable to surface recombination can be prevented by passivating the isolation portion I using the first passivation film 190A. Accordingly, productivity can be improved because a defective ratio of solar cells is reduced through a simple process.

In some embodiments, in the electrode forming step S8, the first and the second electrodes 150 and 140 may be formed by coating pastes for forming the first and the second electrodes 150 and 140 on the first and the second passivation films 190A and 190B using screen printing and then using a thermal treatment method, such as fire through or laser firing contact (or laser firing contact).

If the first electrode and the second electrode are formed using a printing method and a thermal treatment method as described above, the first and the second opening portions 102 and 104 are naturally formed when the first and the second electrodes 150 and 140 are formed. Accordingly, the manufacturing process can be further simplified because a separate process for forming the first and the second opening portions 102 and 104 is not required.

An example in which the first electrode and the second electrode are formed using a printing method and a thermal treatment method as described above is described in more detail below.

Figure 16:
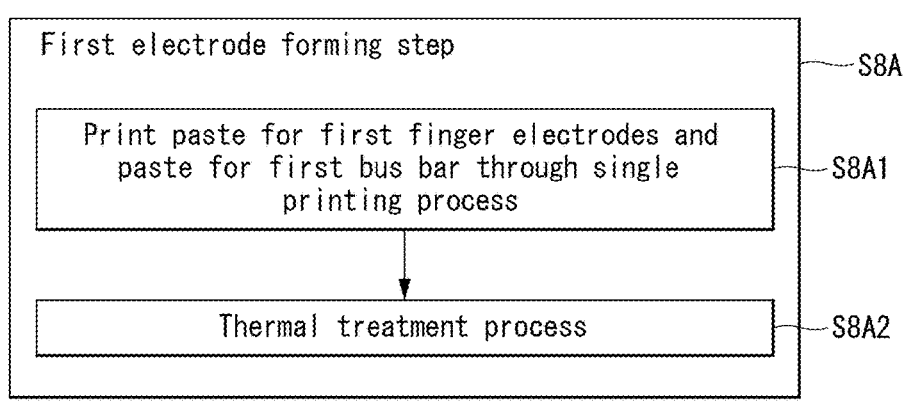
FIG. 16 is a flowchart illustrating an example of a method for manufacturing a solar cell according to a second embodiment of the present invention.
Figure 17:
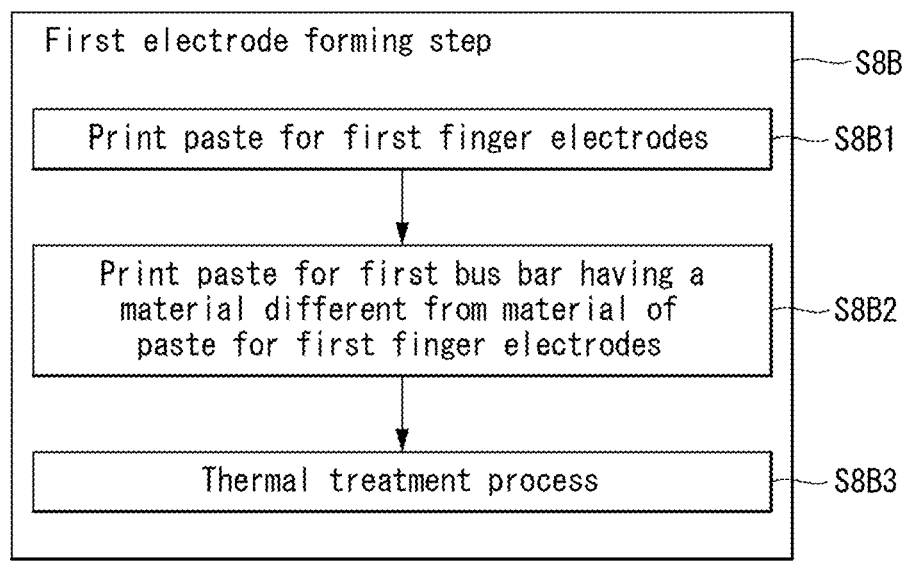
FIG. 17 is a flowchart illustrating an example of a method for manufacturing a solar cell according to a third embodiment of the present invention.

FIG. 16 is a flowchart illustrating an example of a method for manufacturing a solar cell according to a second embodiment of the present invention. FIG. 17 is a flowchart illustrating an example of a method for manufacturing a solar cell according to a third embodiment of the present invention.

The remaining steps (operations) of FIGS. 16 and 17 other than a first electrode forming step are the same as those of FIGS. 12 and 13A to 15, and thus different portions are chiefly described.

Accordingly, as in the manufacturing method of the first embodiment, each of the methods for manufacturing a solar cell according to the second embodiment and third embodiment of the present invention may include the tunnel layer forming step S1, the intrinsic semiconductor layer forming step S2, the first conductive type semiconductor region forming step S3, the removing step S4, the second conductive type semiconductor region forming step S5, the anti-reflection layer and second passivation film forming step S6, the first passivation film forming step S7, and the electrode forming step S8.

The remaining steps (operations) other than the electrode forming step S8 may be the same as those of the first embodiment, and thus a description thereof is omitted.

In the second embodiment or the third embodiment, the electrode forming step S8 may include the step of forming the first electrode and the step of forming the second electrode. In this instance, the step of forming the second electrode may be the same as that of the method for manufacturing a solar cell according to the first embodiment of the present invention, or the first electrode forming step S8 according to the second embodiment or the third embodiment may be applied to the step of forming the second electrode without a change. Accordingly, in an embodiment of the present invention, a detailed description of the method for forming the second electrode is omitted because it is not specially limited.

The step of forming the first electrode in the second embodiment or the third embodiment is described in detail because it is different from that in the first embodiment.

In the method for manufacturing a solar cell according to the second embodiment or the third embodiment, the first electrode forming step S8 may include a process for printing a paste for the first finger electrodes for forming the first finger electrodes and a paste for the first bus bar for forming the first bus bar on the first passivation film 190A and a thermal treatment process.

In the thermal treatment process, the paste for the first finger electrodes and the paste for the first bus bar may perforate the first passivation film and may be connected to the first conductive type semiconductor region. Accordingly, the step of forming the opening portion in the first passivation film may be performed during the thermal treatment process of the electrode forming step.

More specifically, in the method for manufacturing a solar cell according to the second embodiment of the present invention, a first electrode forming step S8A may include a process S8A1 for printing the paste for the first finger electrodes and the paste for the first bus bar on the first passivation film 190A through a single printing process and a thermal treatment process S8A2.

In this instance, a material included in the paste for the first finger electrodes for forming the first finger electrodes 151 and a material included in the paste for the first bus bar for forming the first bus bar 153 may be the same.

Thereafter, the paste for the first finger electrodes and the paste for the first bus bar perforate the first passivation film 190A and are connected to the first conductive type semiconductor region 170 through the thermal treatment process. Accordingly, the paste for the first finger electrodes and the paste for the first bus bar may be partially depressed into the first conductive type semiconductor region 170 and then fired, thereby forming the first finger electrodes 151 and the first bus bar 153, such as those shown in FIG. 5.

Furthermore, during the thermal treatment process, metal may be extracted from the paste for the first finger electrodes and the paste for the first bus bar and recrystallized. Accordingly, the metal crystals MC may be formed in the electrode forming region 170A of the first conductive type semiconductor region 170.

In this instance, the highest temperature of the thermal treatment process may be between 700° C. to 900° C., more specifically, between 795° C. to 870° C.

If the highest temperature of the thermal treatment process is 795° C. or more, the paste for the first finger electrodes and the paste for the first bus bar can perforate the first passivation film 190A and can be connected to the first conductive type semiconductor region 170.

If the highest temperature of the thermal treatment process is 870° C. or less, the metal crystals MC recrystallized when metal is extracted from the paste for the first finger electrodes and the paste for the first bus bar can be prevented from penetrating the tunnel layer 160.

Furthermore, in the method for forming a solar cell according to the third embodiment of the present invention, a first electrode forming step S8B may include a process S8B1 for printing the paste for the first finger electrodes on the first passivation film 190A in order to form the first finger electrodes 151, a process S8B2 for printing the paste for the first bus bar having a material different from the material of the paste for the first finger electrodes on the first passivation film 190A in order to form the first bus bar 153, and a thermal treatment process S8B3, as shown in FIG. 17.

In FIG. 17, the process S8B1 for printing the paste for the first finger electrodes has been illustrated as being first performed and the process S8B2 for printing the paste for the first bus bar has been illustrated as being then performed, but sequence of the two processes may be reversed.

As described above, the first finger electrodes 151 and the first bus bar 153, such as those shown in FIG. 9, may be formed through the first electrode forming step S8, such as that shown in FIG. 17.

As described above, in the method for forming a solar cell according to the third embodiment of the present invention, the paste for the first finger electrodes and the paste for the first bus bar may be performed by the separate printing processes S8B1 and S8B12.

Furthermore, in this instance, a material included in the paste for the first finger electrodes and a material included in the paste for the first bus bar may be different.

More specifically, content of frit glass per unit volume which is included in the paste for the first bus bar may be smaller than content of frit glass per unit volume which is included in the paste for the first finger electrodes, or frit glass may not be included in the paste for the first bus bar.

The reason for this is that while the paste for the second finger electrodes perforates the first passivation film 190A and is depressed into the first conductive type semiconductor region 170 in the thermal treatment process for forming the first electrode 150, the paste for the first bus bar perforates the first passivation film 190A, but is rarely depressed into the first conductive type semiconductor region 170 although it is connected to the first conductive type semiconductor region 170 or the paste for the first bus bar does not perforate the first passivation film 190A.

In this instance, the metal crystals MC may not be formed in the bus bar forming region 170A2 of the first conductive type semiconductor region 170, and the semiconductor substrate 100 can be prevented from being deteriorated.

Furthermore, content of frit glass per unit volume which is included in the plurality of first finger electrodes 151 may be the same as content of frit glass per unit volume which is included in the second electrode 140.

After the paste for the second electrode is coated, the second electrode 140 may also perforate the anti-reflection layer 130 and may be connected to the second conductive type semiconductor region 120. If content of frit glass per unit volume which is included in the paste for the second finger electrodes is the same as that included in the second electrode 140, speed at which the paste for the second electrode perforates the anti-reflection layer 130 and is depressed into the second conductive type semiconductor region 120 and speed at which the paste for the second finger electrodes perforates the first passivation film 190A and is depressed into the first conductive type semiconductor region 170 in the same thermal treatment process may become approximately the same.

Accordingly, temperatures in the thermal treatment processes for forming the second electrode 140 and the first electrode 150 may become the same, and speed at which the first finger electrodes 151 are depressed into the first conductive type semiconductor region 170 can be limited.

Furthermore, content of a metal material per unit volume which is included in the plurality of first finger electrodes 151 may be greater than content of a metal material per unit volume which is included in the plurality of first bus bars 153.

For example, content of a metal material per unit volume which is included in the plurality of first finger electrodes 151 may be 80 wt % or more to 95 wt % or less. Content of a metal material per unit volume which is included in the plurality of first bus bars 153 may be 60 wt % or more 80 wt % or less.

If content of a metal material per unit volume which is included in the first finger electrodes 151 is 80 wt % or more 95 wt % or less as described above, the metal crystals MC can be sufficiently formed as described above with reference to FIG. 6 and resistance of the first finger electrodes 151 having relatively narrow widths can be sufficiently lowered in the state in which the paste for the second finger electrodes has perforated the first passivation film 190A and is depressed into the first conductive type semiconductor region 170.

Furthermore, if content of a metal material per unit volume which is included in the first bus bar 153 is 60 wt % or more 80 wt % or less, the metal crystals MC may not be formed in the bus bar forming region 170A2 of the first conductive type semiconductor region 170 due to the metal material included in the paste for the first bus bars although part of the paste for the first bus bars perforates the first passivation film 190A and is connected to the first conductive type semiconductor region 170, or the metal crystals MC may not be formed in the tunnel layer 160 as described above with reference to FIG. 7 although the metal crystals MC are formed in the bus bar forming region 170A2.

Furthermore, content of a metal material per unit volume which is included in the plurality of first finger electrodes 151 may be the same as content of a metal material per unit volume which is included in the second electrode 140.

If the first finger electrodes 151 and the first bus bar 153 having different materials are formed as described above, the deterioration of the semiconductor substrate 100 can be prevented, and the deterioration of efficiency of the solar cell can be further prevented.

As described above, the deterioration of the semiconductor substrate 100 may be generated during the thermal treatment process for forming the first electrode 150. If a temperature in the thermal treatment process is too low, the deterioration of efficiency of the solar cell can be prevented because contact resistance of the first electrode 150 is excessively increased.

The embodiments of the present invention have been described in detail above, but the scope of the present invention is not limited thereto. The scope of the present invention also includes a variety of modifications and changes which are defined in the appended claims and which will be performed by those skilled in the art using the basic concept of the present invention.

What is claimed is:

1. A solar cell, comprising:
   a semiconductor substrate;
   a tunnel layer on a first surface of the semiconductor substrate;
   a first conductive type semiconductor region deposited on the tunnel layer;
   an emitter region deposited on a second surface opposite to the first surface of the semiconductor substrate;
   a first passivation film on the first conductive type semiconductor region; and
   a first electrode connected to the first conductive type semiconductor region through an opening in the first passivation film, the first electrode including:
      a plurality of first finger electrodes spaced apart from each other and extended in parallel in a first direction; and
      a first bus bar connected to the plurality of first finger electrodes
   wherein at least part of the first electrode is depressed and formed in the first conductive type semiconductor region, the first electrode includes a metal material and a glass frit, and an amount of glass frit per unit volume in the plurality of finger electrodes is less than an amount of glass frit per unit volume in the bus electrode.

2. The solar cell of claim 1, wherein an amount of metal material per unit volume in the plurality of first finger electrodes is greater than an amount of metal material per unit volume in the first bus bar, the amount of metal material per unit volume in the plurality of first finger electrodes ranges from 80 wt % to 95 wt %, and amount of metal material per unit volume in the first bus bar ranges from 60 wt % to 80 wt %.

3. The solar cell of claim 1, wherein the plurality of first finger electrodes have a single layer structure, and the first bus bar has a double layer structure.

4. The solar cell of claim 1, wherein the first conductive type semiconductor region includes a polycrystalline silicon material, and the emitter region includes a single crystal silicon material.

5. The solar cell of claim 1, wherein the first passivation film includes a side portion extended up to a top of a side of the semiconductor substrate.

6. The solar cell of claim 1, further comprising:
   a second passivation film on the emitter region;
   an anti-reflection layer on the second passivation film; and
   a second electrode connected to the emitter region through an opening in the second passivation film and the anti-reflection layer.

7. The solar cell of claim 6, wherein at least part of the second electrode is depressed and formed in the emitter region.

8. The solar cell of claim 1, further comprising:
   a first boundary surface in which the first conductive type semiconductor region and the first electrode come into contact with each other; and
   a second boundary surface in which the first conductive type semiconductor region and the first passivation film come into contact with each other,
   wherein the first boundary surface is arranged closer to the semiconductor substrate than the second boundary surface.

9. The solar cell of claim 8, wherein a difference between a height of the first boundary surface and a height of the second boundary surface ranges from 1 nm to 20 nm.

10. The solar cell of claim 1, further comprising a plurality of metal crystals extracted from the first electrode and formed in an electrode forming region of the first conductive type semiconductor region in which the first electrode is formed.

11. The solar cell of claim 10, wherein the plurality of metal crystals are not formed in a non-forming region which belongs to the first conductive type semiconductor region and in which the first electrode is not formed,
wherein the plurality of metal crystals are not in the tunnel layer, and
wherein the plurality of metal crystals are in direct contact with the first electrode.

12. The solar cell of claim 10, wherein the plurality of metal crystals are not formed in a non-forming region which belongs to the first conductive type semiconductor region and in which the first electrode is not formed,
wherein the plurality of metal crystals are not in the tunnel layer, and
wherein the plurality of metal crystals are spaced apart from the first electrode.

13. The solar cell of claim 10, wherein the plurality of first finger electrodes penetrate the first passivation film and are depressed into the first conductive type semiconductor region, and the first bus bar penetrates the first passivation film and is depressed into the first conductive type semiconductor region,
wherein the electrode forming region of the first conductive type semiconductor region includes a finger forming region and a bus bar forming region, and
wherein metal crystals extracted from the plurality of first finger electrodes are formed in the finger forming region, and metal crystals extracted from the first bus bar are formed in the bus bar forming region.

14. The solar cell of claim 10, wherein the plurality of first finger electrodes penetrate the first passivation film and are depressed into the first conductive type semiconductor region, and the first bus bar does not penetrate the first passivation film but is formed on the first conductive type semiconductor region,
wherein the electrode forming region of the first conductive type semiconductor region includes a finger forming region, and
wherein the plurality of metal crystals is formed only in the finger forming region.

15. The solar cell of claim 10, wherein the plurality of metal crystals include first metal crystals in a direct contact with the first electrode and second metal crystals spaced apart from the first electrode.

16. The solar cell of claim 10, wherein a length of the plurality of metal crystals in a direction from the first electrode to the tunnel layer is ⅔ or less of a thickness of the first conductive type semiconductor region.

* * * * *